US 8,571,738 B1

(12) United States Patent
Potter et al.

(10) Patent No.: US 8,571,738 B1
(45) Date of Patent: Oct. 29, 2013

(54) AUTOMOTIVE VEHICLE BATTERY POWER SYSTEM MONITORING SYSTEMS, APPARATUS AND METHODS

(75) Inventors: Russell Potter, Port Moody (CA); Wei Dong, Vancouver (CA); Minjie Shi, Burnaby (CA); Patrick Belanger, Port Moody (CA)

(73) Assignee: JTT Electronics Ltd, Vancouver (CA)

( * ) Notice: Subject to any disclaimer, the term of this patent is extended or adjusted under 35 U.S.C. 154(b) by 0 days.

(21) Appl. No.: 13/517,567

(22) Filed: Jun. 13, 2012

(51) Int. Cl.
*B60L 11/00* (2006.01)
*G01N 27/416* (2006.01)
*B60Q 1/00* (2006.01)

(52) U.S. Cl.
USPC ............................. 701/22; 324/434; 340/455

(58) Field of Classification Search
USPC .............. 701/22, 34.4; 180/65.1, 65.29, 68.4; 324/434, 503, 525, 426–433, 522; 340/455; 320/134, 116, 117, 118, 119, 320/122, 138, 104; 307/71, 428
See application file for complete search history.

(56) References Cited

U.S. PATENT DOCUMENTS

| | | | |
|---|---|---|---|
| 3,740,652 A | 6/1973 | Burgener | |
| 4,458,196 A | 7/1984 | Goyal et al. | |
| 5,382,946 A | 1/1995 | Gale | |
| 5,701,068 A | 12/1997 | Baer et al. | |
| 5,710,501 A | 1/1998 | van Phuoc et al. | |
| 6,020,717 A | 2/2000 | Kadouchi et al. | |
| 6,078,165 A | 6/2000 | Ashtiani et al. | |
| 6,094,031 A | 7/2000 | Shimane et al. | |
| 6,320,389 B1 | 11/2001 | Tamesue et al. | |
| 6,833,708 B2 | 12/2004 | Furukawa | |
| 6,906,525 B2 | 6/2005 | Suzuki | |
| 6,919,726 B2 | 7/2005 | Yudahira | |
| 6,984,988 B2 | 1/2006 | Yamamoto | |
| 7,199,489 B2 | 4/2007 | Gottlieb et al. | |
| 7,292,042 B2 | 11/2007 | Morita et al. | |
| 7,405,579 B2 | 7/2008 | Okamoto et al. | |
| 7,459,914 B2 | 12/2008 | Lindsey et al. | |
| 7,471,065 B2 | 12/2008 | Emori et al. | |
| 7,511,457 B2 | 3/2009 | Emori et al. | |
| 7,755,326 B1 | 7/2010 | Thivierge | |
| 2004/0130326 A1 | 7/2004 | Yamamoto | |
| 2008/0180106 A1* | 7/2008 | Gorbold | 324/434 |
| 2008/0238432 A1* | 10/2008 | Botker et al. | 324/434 |
| 2010/0052692 A1 | 3/2010 | Yano et al. | |
| 2012/0062034 A1* | 3/2012 | Shu et al. | 307/71 |

* cited by examiner

*Primary Examiner* — Muhammad Shafi
(74) *Attorney, Agent, or Firm* — Richard A. Johnson; Borden Ladner Gervais LLP

(57) ABSTRACT

A battery monitoring system comprises a battery control unit (BCU) and a plurality of module control units (MCUs) connectable to battery modules. The BCU comprises a low voltage power supply, a BCU controller, and a reference address signal source connected to an address signaling path. The MCUs receive low voltage power from the BCU. Each MCU comprises an address signal input and output with a signal coupler therebetween for connecting the module control unit along the address signaling path, and an MCU controller. The BCU controller determines a number of MCUs on the address signaling path, and each MCU controller determines the associated MCU's position along the address signaling path, based at least in part on a detected signal on the address signaling path and predetermined properties of the reference address signal and address signal coupler. A ground fault detection unit may provide a fault signal to the BCU controller.

20 Claims, 9 Drawing Sheets

US 8,571,738 B1

AUTOMOTIVE VEHICLE BATTERY POWER SYSTEM MONITORING SYSTEMS, APPARATUS AND METHODS

TECHNICAL FIELD

This invention relates to systems, apparatus and methods for monitoring and controlling battery systems of electric powered automotive vehicles. More particularly, the systems, methods and apparatus involve interconnecting control and monitoring units associated with battery modules and central control and monitoring units.

BACKGROUND

Some electric powered automotive vehicles comprise electrical power systems having a plurality of battery cells arranged to provide a high voltage electricity supply. In some such vehicles, battery cells are grouped together into battery modules, and a plurality of battery modules are connected together to form a battery stack. For reasons including, among other things, optimizing battery performance and ensuring batteries operate safely, it is desirable to monitor operational characteristics of individual battery cells (e.g., voltage, charge, current, temperature, etc.) within a battery stack, and to control the operation of individual battery cells (e.g., charging, discharging, load, etc.).

In some electric powered automotive vehicles, control of individual battery cells is coordinated (e.g., by a central controller and/or cooperation among different controllers). Such coordination requires communication between apparatus which monitor characteristics of and/or control one or more particular battery cells (e.g., groups of battery cells, such as the cells of a particular battery module) and one or both of other such apparatus and a central controller. Such communication may be facilitated by a network that interconnects monitoring/control apparatus and/or a central controller.

Several challenges are associated with networking monitoring/control apparatus and/or a central controller in an automotive environment, including, for example:
- electrical noise, heat and physical interference, and other adverse conditions characteristic of the automotive environment present multiple failure modes for wiring, wiring connections and signaling;
- space limitations and the requirement that automotive systems be amenable to rapid assembly limits the complexity of wiring configurations that may reasonably be implemented; and
- battery stacks may be modular and/or have different configurations among different vehicles, such the same network topology cannot be applied to all configurations.

There is accordingly a desire for improved apparatus and methods that enable communications between and/or among battery cells monitoring/control apparatus and/or central controllers.

A ground fault in the power system of an electric powered automotive vehicle is undesirable, for example because it may pose a shock hazard and/or drain the electrical power supply of the vehicle. Accordingly, it is desirable that the presence of a ground fault be detected, in order that it can be remedied or other corrective action taken. It is further desirable that a ground fault be characterized, for example by impedance, in order that the cause of the ground fault may more quickly be determined. There is accordingly a desire for improved apparatus and methods for detecting and characterizing ground faults in the power systems of electric powered automotive vehicles.

Patent literature describing technology relating to the general field of this invention includes:
U.S. Pat. No. 7,755,326;
U.S. Pat. No. 6,020,717;
U.S. Pat. No. 7,199,489;
U.S. Pat. No. 6,078,165;
U.S. Pat. No. 5,701,068;
U.S. Pat. No. 5,710,501;
U.S. Pat. No. 6,094,031;
U.S. Pat. No. 7,405,579;
U.S. Pat. No. 7,511,457;
U.S. Pat. No. 7,471,065;
U.S. Pat. No. 3,740,652;
U.S. Pat. No. 6,906,525; and
US Patent Application Publication No. 2010/0052692.

The inventors have determined a need for improved battery monitoring systems. The inventors have further determined a need for battery monitoring systems which provide robust safety protection and reduced manufacturing costs.

SUMMARY

One aspect provides a battery monitoring system connectable to monitor and control a battery stack comprising a plurality of battery cells. The battery monitoring system comprises a central battery control unit (BCU) a plurality of battery module control units (MCUs). The BCU comprises a power supply configured to provide a low voltage electrical supply, a BCU controller, and an address signal source configured to output a reference address signal on an address signaling path. The MCUs are connectable to receive the low voltage electrical supply from the BCU. Each MCU is connectable to a battery module comprising one or more of the plurality of battery cells. Each MCU comprising an address signal input and an address signal output for connecting the module control unit along the address signaling path, an address signal coupler connected between the address signal input and the address signal output, and an MCU controller. The BCU controller is configured determine a number of the plurality of MCUs on the connected address signaling path based at least in part on a signal detected by the BCU on the address signaling path, a predetermined property of the reference address signal, and a predetermined property of the address signal coupler. Each MCU controller is configured determine a position of an associated MCU along the address signaling path based at least in part on a signal detected by the associated MCU on the address signaling path, a predetermined property of the reference address signal, and a predetermined property of the address signal coupler.

Another aspect provides a method for monitoring a battery stack comprising a plurality of battery cells. The method comprises connecting each of a plurality of module control units (MCUs) to an associated battery module comprising one or more of the plurality of battery cells, connecting the MCUs together in series along a supply rail, a common ground, and an address signaling path wherein each MCU comprises an address signal coupler forming part of the address signaling path, providing a low voltage electrical supply across the supply rail and common ground, providing an address signal on the address signaling path, detecting a source signal on the address signaling path between the source of the address signal and a closest MCU, detecting a local signal on the address signaling path at each of the MCUs, determining a number of the plurality of MCUs on the connected address signaling path based at least in part on the source signal, a predetermined property of the reference address signal, and a predetermined property of the address signal couplers, and determining a position of each MCU along the address signaling path based at least in part on the local signal on the address signaling path, a predetermined property of the reference address signal, and a predetermined property of the address signal coupler.

Another aspect provides a ground fault detection unit comprising a Wheatstone bridge having first and second legs connected at their respective first ends to a first node and connected at their respective second ends to a second node, each leg comprising two series connected resistors, and a bridge connected at a first end to a junction between the two series connected resistors of the first leg and at a second end to a junction between the two series connected resistors of the second leg, the bridge comprising a resistor. A DC current isolator is connected at a first end to the junction between the two series connected resistors of the first leg and at a second end to a high voltage supply provided from a battery stack. A stimulus source is connected to provide transient electrical stimulus to the first node. A differential amplifier has inputs connected across the resistor of the bridge, and an output connected to provide a ground fault signal to a controller of a battery monitoring system.

Further aspects and example embodiments are illustrated in the accompanying drawings and/or described in the following description.

BRIEF DESCRIPTION OF DRAWINGS

The attached drawings show non-limiting example embodiments of the invention.

DESCRIPTION

Throughout the following description specific details are set forth in order to provide a more thorough understanding to persons skilled in the art. However, well known elements may not have been shown or described in detail to avoid unnecessarily obscuring the disclosure. The following description of examples of the technology is not intended to be exhaustive or to limit the system to the precise forms of any example embodiment. Accordingly, the description and drawings are to be regarded in an illustrative, rather than a restrictive, sense.

Interpretation of Terms

Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

Embodiments of the invention provide systems, apparatus and methods for monitoring batteries, and particularly battery stacks such as those used in automotive applications. Certain embodiments provide battery monitoring systems which provide robust safety protection and reliability, while at the same time keeping manufacturing costs relatively low.

Figure 1:
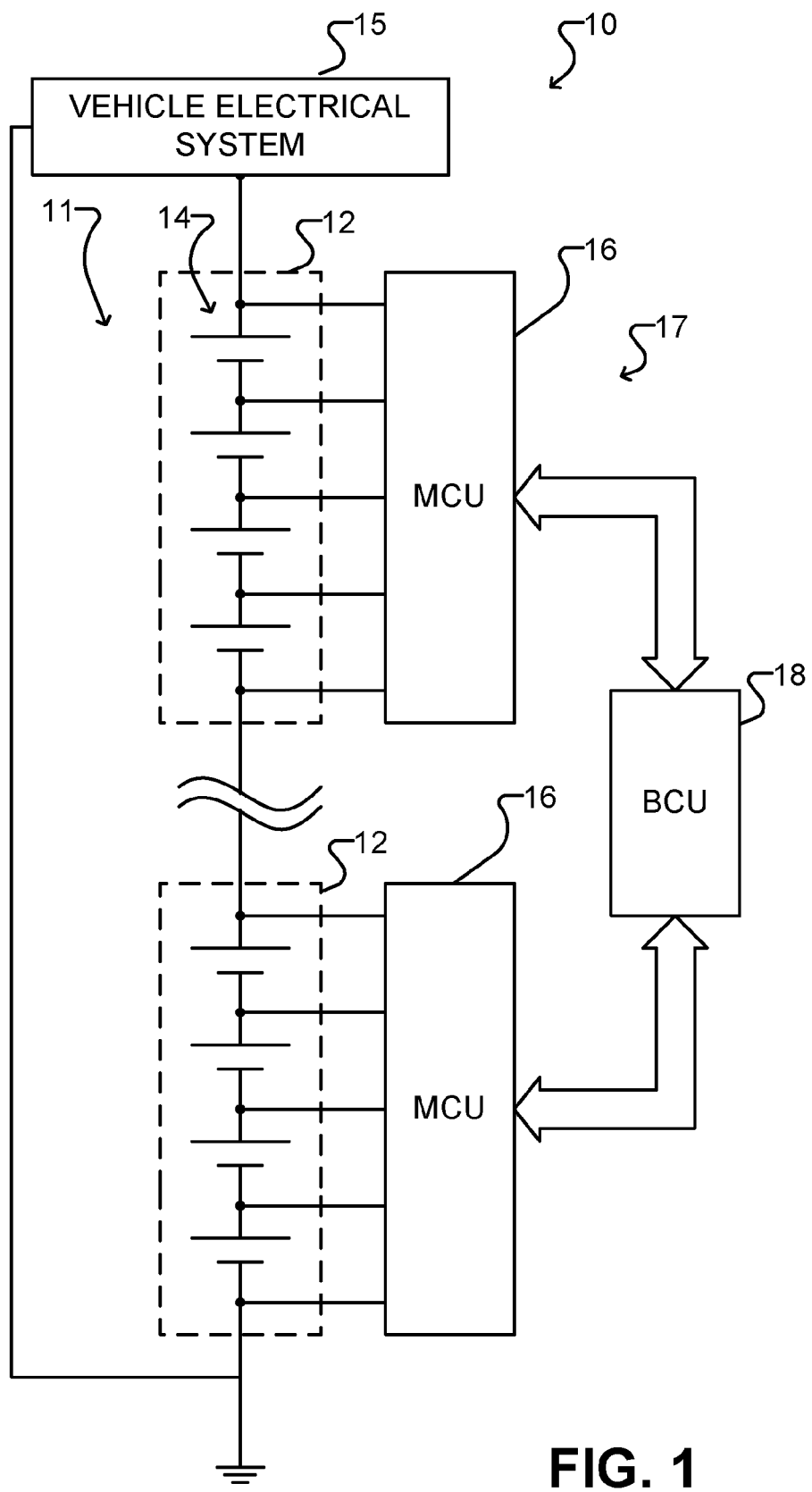
FIG. 1 is a schematic diagram of an automotive battery power system according to an example embodiment.

FIG. 1 is a schematic diagram of an automotive battery power system 10 according to an example embodiment. System 10 comprises a battery stack 11 made up of a plurality of battery modules 12. Each battery module 12 comprises a plurality of battery cells 14. In the illustrated power system 10, battery cells 14 and battery modules 12 are series connected; other power systems comprise battery cells 14 and battery modules 12 connected in parallel or combinations of series and parallel.

Battery stack 11 is connected to provide high voltage DC power to a vehicle electrical system 15. A battery monitoring system 17 is connected to monitor battery stack 11 and control the operation of battery stack 11. Battery monitoring system 17 comprises a plurality of module control units (MCUs) 16 and a battery control unit (BCU) 18.

A module control unit (MCU) 16 is associated with each battery module 12. MCUs 16 are configured to monitor operational characteristics of battery modules 12, battery cells 14 and/or apparatus associated with battery modules 12 and/or battery cells 14 (e.g., switches that connect cells to loads, battery cell charging apparatus, etc.). MCUs 16 may be configured to monitor operational characteristics such as voltage, current, charge, temperature, and the like, for example. In the illustrated embodiment, MCUs 16 are electrically connected across each battery cell 14 of their associated battery modules 12, such that MCUs 16 can monitor the voltage between the terminals of each battery cell 14. In some embodiments, MCUs 16 comprise inputs for receiving information from sensors (not shown) associated with associated battery modules 12, battery cells 14 and/or associated apparatus. MCUs 16 may, for example, comprise inputs for receiving information suitable for monitoring voltage, current, temperature, and the like. In some embodiments, MCUs 16 comprise inputs for receiving measurements of series current to determine resistances of battery cells 14. In some embodiments, MCUs 16 process signals received at their inputs to determine further characteristics of battery cells 14 such as, for example, state of charge (SOC) or state of health (SOH).

MCUs 16 are configured to control the operation of battery modules 12, battery cells 14 and/or apparatus associated with battery modules 12 and/or battery cells 14. MCUs 16 may be configured to control operations such as charging, discharging, and the like, for example. MCUs 16 may be configured to control battery modules 12, battery cells 14 and/or associated apparatus based, at least in part, on monitored and/or computed operational characteristics.

MCUs 16 are coupled to a central battery control unit (BCU) 18. MCUs 16 are configured to communicate information indicative of operational characteristics of battery cells 14 to BCU 18. MCUs 16 are also connected to receive low voltage power from BCU 18 in some embodiments. By powering MCUs 16 from BCU 18 (as opposed to, for example, directly from modules 12) the risk that an MCU could continue to draw power after system 10 is powered down (e.g., due to a hardware or software fault in the MCU or BCU, or other power supply sequencing problems) may be greatly reduced or eliminated.

MCUs 16 and BCU 18 may be communicatively coupled by a local network using standardized communication protocols, such as, for example a Controller Area Network (CAN). In some embodiments, MCUs 16 may communicate individually monitored parameters of battery cells 14 to BCU 18. In some embodiments, MCUs 16 may communicate characteristics computed by processing individually monitored parameters of battery cells 14 to BCU 18. BCU 18 may be configured to determine control information based on measured and/or computed operational characteristics of battery cells 14. In some embodiments, BCU 18 is configured to communicate control information to MCUs 16. MCUs 16 may be configured to control battery cells 14 based, at least in part, on control information communicated by BCU 18.

In some embodiments, a single cable or "harness" comprising a plurality of connectors may be used to interconnect MCUs 16 in series in a "daisy-chain" fashion to BCU 18. For example, in some embodiments a harness connecting each adjacent pair of MCUs 16 and the closest MCU 16 with BCU 18 may comprise a low voltage supply wire, a ground wire, two CAN bus communication wires, an interlock signal wire, and an address signal wire. The functionality of such wires will become apparent from the description of the example embodiments discussed below.

Figure 1A:
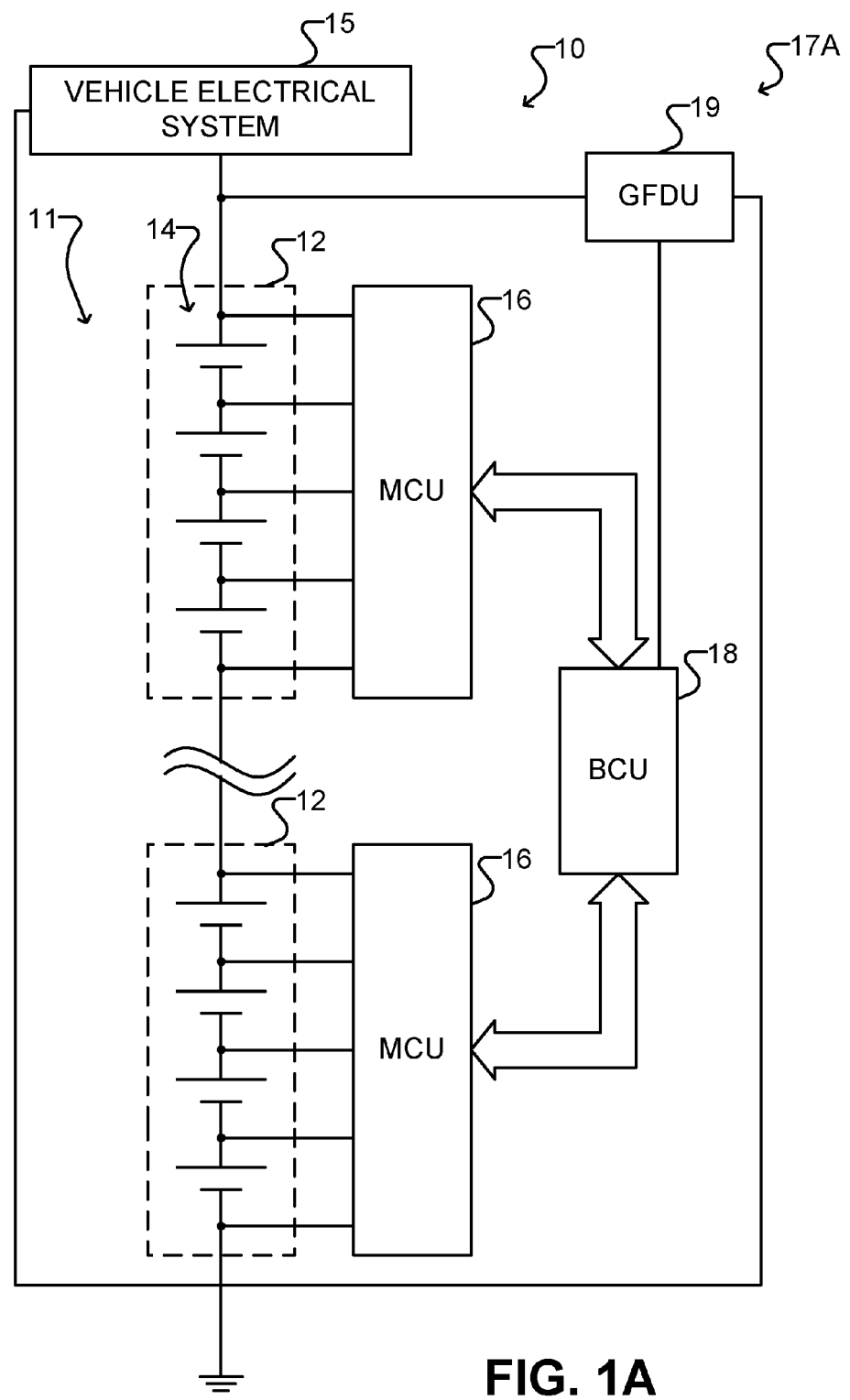
FIG. 1A is a schematic diagram of an automotive battery power system according to another example embodiment.

In some embodiments, BCU 18 and/or MCUs 16 may also be connected to receive signals regarding the status of power system 10 from other sources. For example, FIG. 1A shows a battery monitoring system 17A according to another embodiment, wherein a ground fault detection unit (GFDU) 19 provides ground fault information to BCU 18. An example GFDU is discussed below with reference to FIG. 8.

Figure 2:
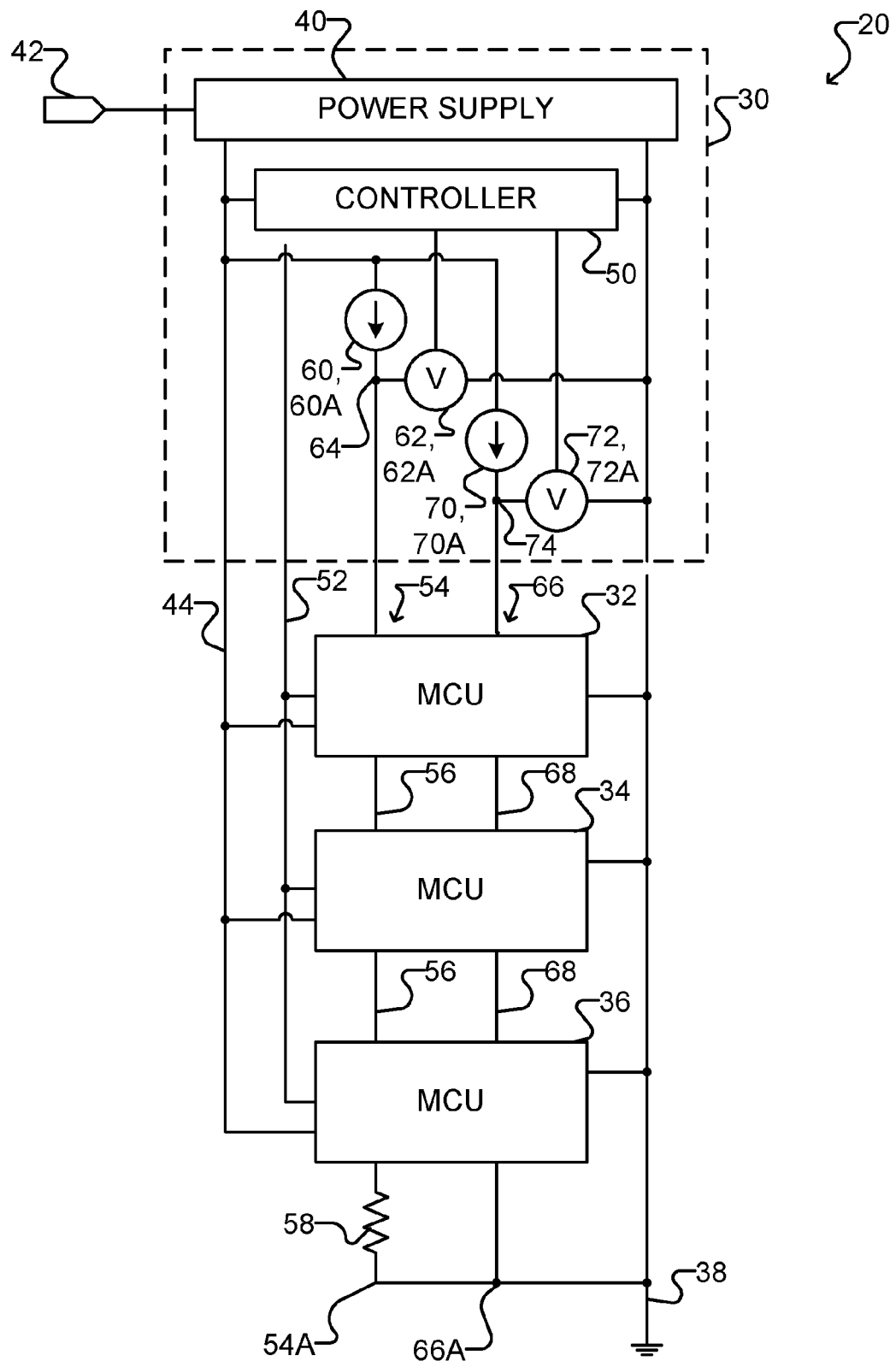
FIG. 2 is a schematic diagram of a battery monitoring system according to an example embodiment.

FIG. 2 shows a schematic diagram of a battery monitoring system 20 according to an example embodiment. In system 20, a BCU 30 is communicatively coupled to a plurality of MCUs 32, 34 and 36, which are each associated with a respective battery module of a battery stack (not shown in FIG. 2). It will be appreciated that systems according to other embodiments may comprise fewer than three or more than three MCUs connected to BCU 30. BCU 30 and MCUs 32, 34, and 36 share a common electrical ground 38. Ground 38 may be the host automotive vehicle's chassis ground, for example.

BCU 30 comprises a power supply unit 40. Power supply unit 40 generates a low voltage electrical supply from an input electrical supply voltage (not shown) connected to terminal 42. The input electrical supply voltage may, for example, be supplied from the battery stack in some embodiments, either directly or through additional power conditioning components. BCU 30 outputs the low voltage electrical supply generated by power supply unit 40 across supply rail 44 and ground 38. In some embodiments, power supply unit 40 generates the low voltage electrical supply by stepping down the voltage of, filtering and/or current limiting the host automotive vehicle's low voltage electrical supply.

BCU 30 comprises a controller 50, which may comprise one or more central processing units (CPU), one or more microprocessors, one or more microcontrollers, one or more field-programmable gate arrays (FPGA), application-specific integrated circuits (ASIC), logic circuits, combinations thereof or any other suitable processing unit(s) comprising hardware and/or firmware and/or software capable of functioning as described herein. Controller 50 is powered by the low voltage electrical supply produced by power supply unit 40.

Controller 50 is communicatively coupled to MCUs 32, 34 and 36 by a shared communication medium, namely bus 52. BCU 30 and MCUs 32, 34 and 36 are configured to communicate over bus 52 according to a suitable communications protocol. Where BCU 30 and MCUs 32, 34 and 36 share a common ground they may communicate using electrical voltage signals on bus 52. In some embodiments, bus 52 comprises an electrical bus, such a controller area network (CAN) bus, for example. Advantageously, coupling controller 50 and MCUs 32, 34 and 36 with a shared communication medium may require less wiring as compared with point-to-point communication media (e.g., star topology).

BCU 30 and MCUs 32, 34, and 36 are serially connected along and form part of an interlock signaling path 54. Interlock signaling path 54 is configured to conduct signals from BCU through each of MCUs 32, 34 and 36 to the end 54A of interlock signaling path 54. As explained below, BCU 30 is configured to detect an interlock condition along interlock signaling path 54.

BCU 30 comprises an interlock signaling source 60 that produces an interlock signal on interlock signaling path 60. In the illustrated embodiment, interlock signaling source 60 comprises a current source 60A configured to output a predetermined constant DC current (which may be referred to herein for convenience as an interlock current), and interlock signaling path 54 comprises electrically conductive media, including wires 56 that interconnect adjacent ones of BCU 30 and MCUs 32, 34 and 36. In some embodiments, the interlock current is in the range of 0.1 mA to 10 mA. In some embodiments, the interlock current may be, for example approximately 1 mA, or any other suitable value.

After passing through the MCU farthest along interlock signaling path 54 from interlock signaling source 60 (in the FIG. 2 embodiment, MCU 36), interlock signaling path 54 terminates through an interlock terminating resistor 58 to ground 38. In some embodiments, resistor 58 has an resistance to electrical current in the range of 100 Ohms to 10 kOhms, depending on the interlock current. In some embodiments, resistor 58 has a value of approximately 1 kOhm.

In some embodiments, interlock signaling path 54 is terminated to ground external to MCU 36. In other embodiments, interlock signaling path 54 is terminated to ground within MCU 36. For example, in some embodiments, resistor 58 is a part of MCU 36 and connects interlock signaling path 54 to a ground within MCU 36. In some embodiments, each of MCUs 32, 34 and 36 comprises an interlock switch for selectively terminating interlock signaling path 54 either to an internal ground through an internal resistor, or to a connector by which interlock signaling path 54 is continued by a modular connector component to another MCU (if any is present). In some embodiments, an interlock switch may be set up in conjunction with a connector so that the interlock signaling path is automatically terminated when installing the system. For example, in some embodiments if any MCU is not connected to a downstream MCU, the connector and interlock switch are configured such that interlock signaling path is terminated (e.g., grounded through a suitable resistance) at that MCU by default.

BCU 30 comprises an interlock signal detector 62 configured to generate a signal indicative of a signal detected at a point on interlock signaling path 54, and to communicate the generated signal to controller 50. In the illustrated embodiment, the interlock signal detector of BCU 30 comprises voltage detector 62A, which is configured to detect the voltage at a point 64 on interlock signaling path 54 between interlock signal source 60 and the MCU nearest to interlock signal source 60 along interlock signaling path 54 (in the FIG. 2 embodiment, MCU 32), relative to a reference voltage (in the FIG. 2 embodiment, ground 38). Voltage detector 62A may comprise an analog to digital converter, or other suitable voltage detector, for example. For convenience, the point at which the interlock signal detector (voltage detector 62A) detects a signal on interlock signaling path 54 (point 64) may be referred to herein as the interlock signal detection point. In some embodiments, interlock signal detector 62 may also directly control additional hardware circuits (not shown) such as relays or drivers. For example, in some embodiments, a signal output from interlock signal detector 62 interrupts battery output relay controls in order to isolate the battery from the rest of the power system in safety critical situations. Thus, BCU 30 may provide a safety mechanism controlled through robust hardware circuitry, without the need for any user-intervention or intelligent software control. Controller 50 may also be configured to monitor signals from such additional hardware circuits.

Controller 50 is configured to detect an interlock condition along interlock signaling path 54 based at least in part on the signal detected at interlock signal detection point 64. An interlock condition may comprise, for example, a break in interlock signaling path 54 between interlock signal source 60 and the end 54A of interlock signaling path 54 (e.g., at or after the MCU farthest along interlock signaling path 54 from interlock signaling source 60), a change in the way that any of MCUs 32, 34 or 36 affects a signal on interlock signaling path 54, or the like.

Figure 3:
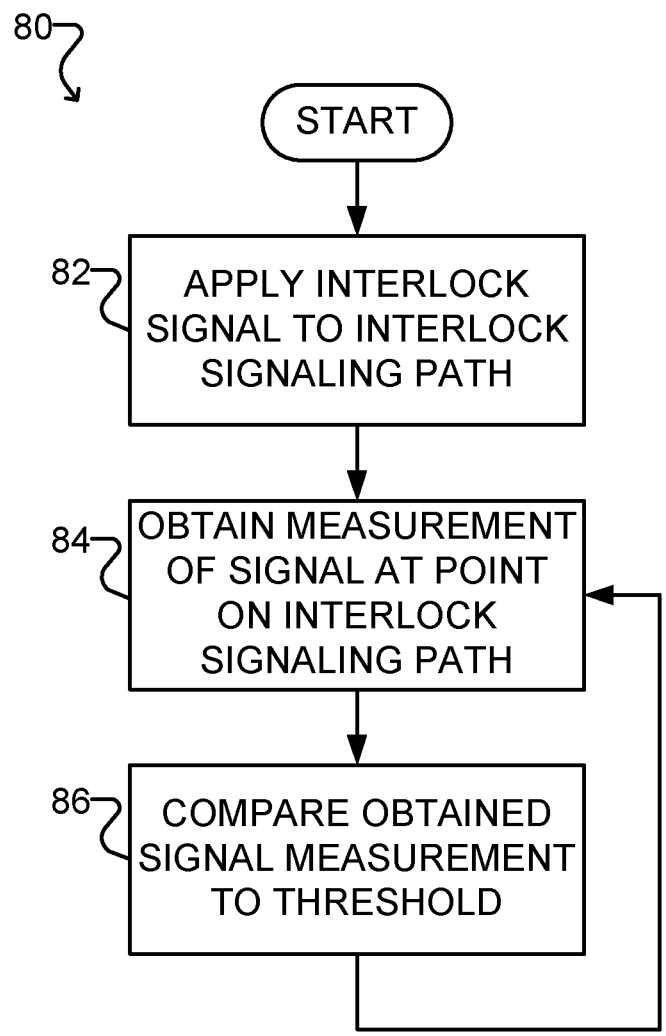
FIG. 3 is a flowchart of a method according to an example embodiment for detecting an interlock condition in some automotive battery power systems.

Controller 50 may be configured to detect an interlock condition along interlock signaling path 54 by comparing the signal detected at interlock signal detection point 64 to a threshold, for example. FIG. 3 is a flowchart of a method 80 according to an example embodiment. BCU 30 may be configured to perform method 80. In step 82, an interlock signal is applied to a first end of an interlock signaling path comprising a plurality of serially connected MCUs between the first end and a second end. For example, step 82 may comprise applying a constant electric current to the interlock signaling path (e.g., activating a constant DC current source connected to the interlock signaling path), for example.

Step 84 comprises obtaining a measurement of the signal at a point on the interlock signaling path between the first end and the one of the plurality of serially connected MCUs nearest to the first end. For example, step 84 may comprise obtaining a measurement of the voltage (e.g., receiving a signal indicative of voltage from a voltage detector) at a point between a current source at the first end of the interlock signaling path and the one of the plurality of serially connected MCUs nearest to the first end.

In step 86, the signal measurement obtained in step 84 is compared to a threshold to determine whether the signal measurement indicates the occurrence of an interlock condition along the interlock signaling path. For example, step 86 may comprise comparing a signal indicative of voltage to a reference signal (e.g., using an analog comparator circuit to compare an analog signal indicative of voltage to an analog reference signal, using digital logic to compare a numeric indication of the voltage to a reference value, etc.). In some embodiments, the signal measurement may indicate either an open or closed interlock path, for example, with an open interlock path (e.g., an interlock condition is present) causing the voltage indicated by the signal measurement floating up to the voltage of the supply rail, and a closed interlock path (e.g., no interlock condition is present) causing the voltage indicated by the signal measurement to be a predetermined level based on the interlock current and an overall resistance of interlock signaling path (including any interlock terminating resistor). In other embodiments, step 86 may comprise comparing the signal measurement obtained in step 84 to a plurality of different thresholds to determine whether the signal measurement indicates the occurrence one or more of a plurality of interlock conditions along the interlock signaling path.

After step 86, method 80 returns to step 84. In some embodiments, method 80 is performed continuously. Continuous measurement of the signal on the interlock path may provide increased reliability and safety by allowing for rapid response to any interlock condition. Also, by implementing method 80 as a continuous process, overall simplicity of the monitoring system may be maximized and overall cost may be minimized in some embodiments. In other embodiments, method 80 may be performed intermittently (e.g., by applying an interlock signal for a fraction of a second every second) in order to save power. In embodiments wherein method 80 is performed intermittently, the signal on the interlock path may, for example, be latched when it is applied, and held when method 80 is not being performed.

In some embodiments, controller 50 is configured to determine whether there is a break in interlock signaling path 54 based on the voltage detected by voltage detector 62A and a threshold derived, at least in part, from the interlock current and the known resistance between interlock voltage detection point 64 and ground 38 (e.g., the sum of the resistances of resistor 58 and MCUs 32, 34 and 36 to current on interlock signaling path 54 in the non-interlock state). When MCUs 32, 34 and 36 are present along interlock signaling path 54, the voltage at interlock signal detection point 64 will be at least approximately equal to the product of the interlock current and the resistance between interlock signal detection point 64 and ground 38. But when there is a break in interlock signaling path 54, (e.g., due to one or more of MCUs 32, 34 and 36 being disconnected from wires 56), interlock signal source 60 faces an open circuit, and the voltage at interlock signal detection point 64 floats up to the voltage of supply rail 44. Controller 50 may be configured to detect a break in interlock signaling path 54 by comparing the voltage detected by voltage detector 62A to a predetermined threshold voltage that is based on the product of the interlock current and the resistance between interlock voltage detection point 64 and ground 38. For example, in an example embodiment with a 5.0V supply, nominal voltage (when no interlock condition is present) at voltage detection point 64 may be 1.0V, and controller 50 may be configured to indicate that the system is operating within acceptable parameters (for example, by generating a "system OK" signal or the like) as long as the voltage at voltage detection point 64 is within an acceptable range of 0.8V to 3.5V. If the voltage at voltage detection point 64 is below the acceptable range, controller 50 may be configured to indicate a short circuit along interlock signaling path 54, and if the voltage at voltage detection point 64 is above the acceptable range, controller 50 may be configured to indicate an open circuit (e.g. an interlock condition) along interlock signaling path 54. By setting the upper bound of the acceptable range to be greater than the nominal voltage, controller 50 may avoid false positives which could be introduced by fluctuations of the voltage at voltage detection point 64. The upper bound of the acceptable range will be somewhat lower than the supply voltage, depending on the configuration of the threshold detection and sensing circuitry.

MCUs 32, 34 and 36 may be configured to cause an interlock condition along interlock signaling path 54 in the event of one or more predetermined conditions at their respective associated battery modules (e.g., battery cell temperature outside operating range, battery cell voltage outside of operating range, etc.). In some embodiments, one or more of MCUs 32, 34 and 36 is configured to cause an interlock condition along interlock signaling path 54 by changing interlock signaling path 54. For example, in some embodiments each of MCUs 32, 34 and 36 comprises an interlock switch configured to open when any of the predetermined conditions occur at their respective associated battery modules, such that an open interlock switch in any of MCUs 32, 34 and 36 results in an open circuit along interlock signaling path 54. MCUs 32, 34 and 36 may also be configured to communicate the status of their respective interlock switches to controller 50 through bus 52, along with any relevant conditions present at their respective associated battery modules, such that controller 50 may determine the location and nature of problematic conditions.

For instance, MCUs 32, 34 and 36 may be configured to present substantially zero resistance to current on interlock signaling path 54 in the non-interlock state, such that the resistance between the interlock signal detection point and ground 38 is substantially the same as resistor 58, and configured to present infinite resistant to current on interlock signaling path 54 (e.g., an open circuit) in the interlock state. In this embodiment, when all of MCUs 32, 34 and 36 are in the non-interlock state, current flows from interlock signal source 60 through resistor 58 to ground 38, and the voltage at interlock signal detection point 64 is approximately equal to the product of the interlock current and the resistance of resistor 58. But when any of MCUs 32, 34 and 36 is in the interlock state, no current flows in interlock signaling path 54 and the voltage at interlock signal detection point 64 floats up to the voltage of supply rail 44.

In other embodiments, each of MCUs 32, 34 and 36 may be configured to present a first resistance to current on interlock signaling path 54 in a non-interlock state, and to present a second resistance to current on interlock signaling path, different from the first resistance, in an interlock state. By changing from the non-interlock state to the inter-lock state, MCUs 32, 34 and 36 may change interlock signaling path 64 by increasing its resistance. In embodiments according to this example, controller 50 is configured to determine whether one or more of MCUs 32, 34 and 36 is in the interlock state based at least in part on the voltage detected by voltage detector 62A, the interlock current and the known first and second resistances of MCUs 32, 34 and 36. The first resistances of MCUs 32, 34 and 36 may all be the same or be different. The second resistances of MCU 32, 34 and 36 may all be same or may be different. For example, in some embodiments, particular combinations of second resistances of MCUs 32, 34 and 36 may be used such that the location of an interlock condition interruption is indicated by the voltage at interlock signal detection point 64. Also, in some embodiments, MCUs 32, 34 and 36 may present more than two different resistances to interlock signaling path 54, wherein the resistance presented by each of MCUs 32, 34 and 36 depends on the nature of the condition causing the interlock. However, it is to be understood that in certain preferred embodiments each of MCUs 32, 34, 36 are substantially the same for the sake of simplicity and to avoid the need for additional circuitry or complicated control algorithms BCU 30 and MCUs 32, 34, and 36 are serially connected along and form part of address signaling path 66. Each of MCUs 32, 34 and 36 is configured to affect a signal on address signaling path 66 in a substantially identical manner. BCU 30 is configured to detect effects of MCUs 32, 34 and 36 on the signal on address signaling path 66 and ascertain the number of MCUs on address signaling path 66 based at least in part on the detected effects. MCUs 32, 34 and 36 are each configured to detect effects of MCUs 32, 34 and 36 on the signal on address signaling path 66, and determine addresses for themselves (e.g., addresses useful in a communications protocol by which communication occurs on communication medium 52) based at least in part on the detected effects.

BCU 30 comprises an address signaling source 70 that outputs a reference address signal on address signaling path 66. In the illustrated embodiment, address signaling source 70 comprises a current source 70A configured to output a predetermined constant DC current (which may be referred to herein for convenience as an address current), and address signaling path 64 comprises electrically conductive media, including wires 68 that interconnect adjacent ones of BCU 30 and MCUs 32, 34 and 36. In some embodiments, the address current is in the range of 0.1 mA to 10 mA. In some embodiments, the address current is 1 mA. After passing through the MCU farthest along address signaling path 66 from address signaling source 70 (in the FIG. 2 embodiment, MCU 36), address signaling path 66 terminates to ground 38.

In some embodiments, address signaling path 66 is terminated to ground external to MCU 36. In other embodiments, address signaling path 66 is terminated to ground within MCU 36. For example, in some embodiments, MCU 36 comprises a switch for terminating address signaling path 66 to ground within MCU 36. In some embodiments, each of MCUs 32, 34 and 36 comprises an address switch for selectively terminating address signaling path 66 either to an internal ground, or to a connector by which address signaling path 66 may be continued by a modular connector component to another MCU. In some embodiments, an address switch may be set up in conjunction with a connector so that the address signaling path is automatically terminated when installing the system. For example, in some embodiments if any MCU is not connected to a downstream MCU, the connector and address switch are configured such that address signaling path is terminated (e.g., grounded) at that MCU by default.

BCU 30 comprises an address signal detector 72 configured to generate a signal indicative of a signal detected at a point on address signaling path 66, and to communicate the generated signal to controller 50. In the illustrated embodiment, the address signal detector of BCU 30 comprises voltage detector 72A, which is configured to detect the voltage at a point 74 on address signaling path 66 between address signal source 70 and the MCU nearest to address signal source 70 along address signaling path 66 (in the FIG. 2 embodiment, MCU 32), relative to a voltage reference (in the FIG. 2 embodiment, ground 38). Voltage detector 72A may comprise an analog to digital converter, or other suitable voltage detector, for example. For convenience, the point on address signaling path 66 (point 74) at which address signal detector 72 (e.g. voltage detector 72A) detects a signal may be referred to herein as the address signal detection point.

As described above, each of MCUs 32, 34 and 36 is configured to affect a signal on address signaling path 66 in a substantially identical manner. In some embodiments, MCUs 32, 34 and 36 are configured to present the same predetermined resistance to an electrical signal on address signaling path 66. For example, in the illustrated embodiment, each of MCUs 32, 34 and 36 presents the same predetermined resistance to the address current. As a result, the voltage at the address signal detection point is a function of the address current and the sum resistances of MCUs 32, 34 and 36.

In some embodiments, controller 50 is configured to determine the number of MCUs along address signaling path 64 based at least in part on the signal generated by address signal detector 72, a predetermined property of a reference address signal output onto address signaling path 66 and the predetermined effect that MCUs 32, 34 and 36 have on a signal on address signaling path 66. For example, controller 50 may be configured to determine the number of MCUs along address signaling path 66 based at least in part on the voltage detected by voltage detector 72A, the magnitude of the address current and the predetermined resistances of MCUs 32, 34, and 36 to current on address signaling path 66. Given a voltage detected by voltage detector 72A at address signal detection point 74 of V, a predetermined address current magnitude I, and a predetermined resistance of each MCU on address signaling path 66 of R, controller 50 may be configured to determine the number of MCUs N according to the formula N=V/RI, for example.

In the illustrated embodiment, the series resistances of MCUs 32, 34 and 36 along address signaling path 66 constitute a voltage divider. As a result, the voltage at the terminal of any of MCUs 32, 34 and 36 connected to address signaling path 66 nearest to address signal source 70 will be a function of the address current, the sum of the resistances of MCUs 32, 34 and 36, and the position of each MCU along address signaling path 66. In some embodiments, each of MCUs 32, 34 and 36 is configured to detect a signal on address signaling path 66 (e.g., a voltage at a terminal connected to address signaling path 66), and to determine its position P along address signaling path 66 relative to the end 66A of address signaling path 66 based on the detected signal. For example, MCUs 32, 34 and 36 may be configured to determine their positions P along address signaling path 66 relative to the end 66A of address signaling path 66 based on a voltage V detected at a terminal connected to address signaling path 66 according to the formula P=V/IR, where I is the predetermined address current magnitude and R is the predetermined resistance of each MCU on address signaling path 66.

MCUs 32, 34 and 36 may be configured to store the determined position (or the computed value V/IR) in a memory and/or to determine an address for use in shared medium communications (e.g., with BCU 30 over bus 52) based on the determined position (or the computed value V/IR) (e.g., using a lookup table, computable function, or the like) and optionally store such address in a memory.

The application of the formula P=V/IR to determine MCU position along an address signaling path may be illustrated in the context of the example embodiment shown in FIG. 2 as follows. Given a constant current I produced by address signal source 70 and a predetermined resistance of R to current on address signaling path 66 presented by each of MCUs 32, 34 and 36, the voltage V at the terminal of each of MCUs 32, 34 and 36 nearest to address signal source 70 would be 3IR, 2IR and IR, respectively. Accordingly, P for MCUs 32, 34 and 36 would be 3, 2, and 1, respectively.

In some embodiments, MCUs 32, 34 and 36 are each configured to detect the voltage at its terminal connected to address signaling path 66 closest to address signal source 70 and to determine its position P along address signaling path 66 relative to the end 66A of address signaling path 66 according to the formula P=V/IR, in which case values of P will range upward from 1 as discussed above. In some embodiments, MCUs 32, 34 and 36 are each configured to detect the voltage at its terminal connected to address signaling path 66 farthest from address signal source 70, and to determine its position P along address signaling path 66 relative to the end 66A of address signaling path 66 according to the formula P=V/IR. In these embodiments, values of P will range upward from 0, since the terminal of the MCU farthest along address signaling path 66 which is the farthest from the address signal source from address signaling source 70 is connected to ground.

Figure 4:
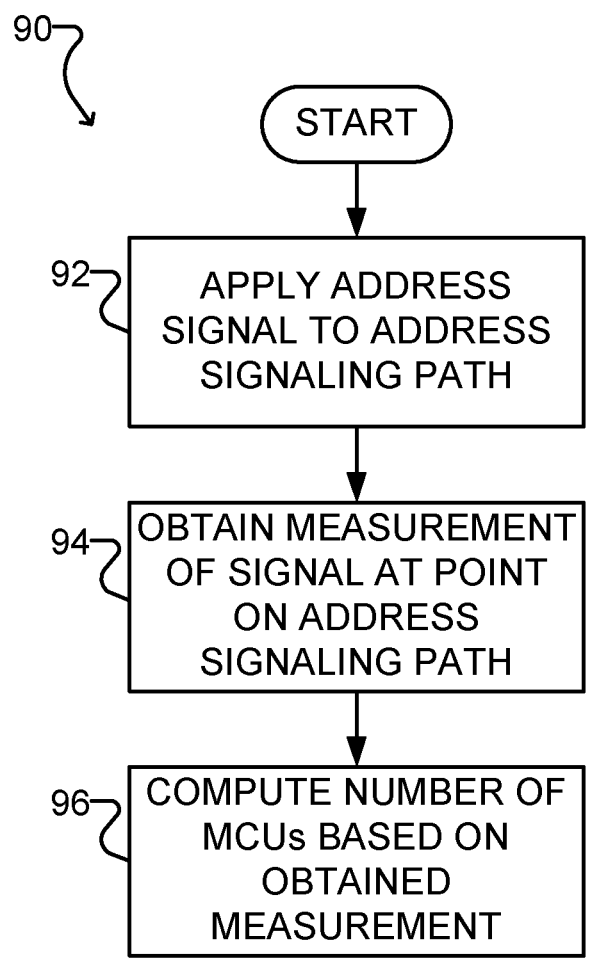
FIG. 4 is a flowchart of a method according to an example embodiment for determining the number of battery module control units in a battery monitoring system.

FIG. 4 is a flowchart of a method 90 for determining the number of MCUs between a point on an address signaling path and an end of the address signaling path. Method 90 may be performed entirely by a BCU or partly by a BCU and an MCU (e.g., as described in examples below).

In step 92, an address signal is applied to a first end of an address signaling path comprising a plurality of serially connected MCUs between the first end and a second end of the address signaling path. For example, step 92 may comprise applying a constant electric current to the address signaling path (e.g., activating a constant DC current source connected to the address signaling path). Step 92 may be performed by a BCU, for example.

Step 94 comprises obtaining a measurement of the signal at a point on the address signaling path between the first end and one of the plurality of serially connected MCUs. In embodiments where step 94 is performed by a BCU, step 94 may comprise, for example, obtaining a measurement of the voltage (e.g., obtaining a signal indicative of voltage from a voltage detector) at a point between a current source at the first end of the address signaling path and the one of the plurality of serially connected MCUs nearest to the first end. In embodiments where step 94 is performed by an MCU, step 94 may comprise, for example, obtaining a measurement of the voltage (e.g., obtaining a signal indicative of voltage from a voltage detector) at a terminal of the MCU connected to the address signaling path (e.g., the terminal nearest the first end of the address signaling path or the terminal nearest the second end of the address signaling path).

In step 96, number of MCUs on the address signaling path between the point at which the signal measurement was obtained in step 94 and the second end of the address signaling path is determined based in part on the signal measurement obtained in step 94. For example, step 96 may comprise computing a number N of MCUs according to the formula N=V/IR, where V is voltage measurement obtained in step 94, I is a predetermined DC electric current applied in step 92, and R is a predetermined resistance of each of the serially connected MCUs on the address signaling path.

It will be appreciated that where step 96 is performed by a BCU based on a signal measurement obtained at a point on the address signaling path between the first end and the one of the plurality of serially connected MCUs nearest the first end, N is the number of MCUs along the address signaling path. It will be appreciated that where step 96 is performed by an MCU based on a signal measurement obtained at the terminal of the MCU connected to the address signaling path, N may be used as an index of the MCU's position along the address signaling path relative to the end of the address signaling path.

In some embodiments method 90 comprises an additional step (not shown in FIG. 4) that comprises determining an address for use in shared medium communications (e.g., according to a bus communication protocol) based on the value of N determined in step 96 (or the computed value V/IR) (e.g., using a lookup table, computable function, or the like) and optionally stores such address in a memory. Such additional step may be performed by a BCU or an MCU.

It will be appreciated that embodiments according to the foregoing description provide systems in which a BCU is configured to autonomously determine the number of MCUs connected along an address signaling path and the MCUs connected along the address signaling path are configured to autonomously determine their unique position along the address signaling path. Certain of these embodiments have one or more of the following advantages:

- where MCUs are configured to autonomously determine unique addresses for themselves, the need for an addresses to be manually configured (which may permit MCUs to be added and substituted to the system without prior configuration) or automatically assigned in a centrally dictated or cooperative negotiated manner is avoided;
- correspondence between an address (e.g., which may be associated with data communicated from such address) and a particular MCU may be determined from the positions of the MCU along the address signaling path, which may be readily apparent upon visual inspection of the battery power system; and
- the ability to correlate cell parameter values (e.g. voltage, temperature, current, etc. as described above) and/or variations in such parameters to their physical locations, facilitating advanced diagnostics and control of temperature and cell balance.

Since the positions of MCUs 32, 34 and 36 are fixed during operation of system 10, it is not necessary that MCUs 32, 34 and 36 always be able to determine their positions along address signaling path 66. In some embodiments, address signaling source 70 of BCU 30 is configured to supply an address signal for only a predetermined time period (e.g., when BCU 30 and/or system 10 is powered on), and MCUs 32, 34 and 36 are configured to determine their positions along address signaling path 66 (e.g., according to the method set out above), during the predetermined time period. BCU 30 and MCUs 32,34 and 36 may be configured to start such a predetermined time period in response to a stimulus, such as upon being powered up, detecting voltage at one or more terminals, upon detecting address current on address signaling path 54, or the like. For example, in some embodiments, address signaling source 70 may only be operation during an initial boot up period for system 10, and may be disabled after addresses for all MCUs are registered.

The couplings between MCUs 16 and BCU 18 (e.g., along interlock signaling path 54 and address signaling path 66) may comprise modular connector components, such as modular wiring components. Modular connector components may comprise connectors removably attachable to corresponding connectors on BCU 30 and MCUs 32, 34 and 36, and may be provided in a variety of configurations (e.g., connector types, run length, etc.) to suit different configurations of BCU 30 and MCUs 32, 34 and 36, and to suit different arrangements of battery modules and battery cells with which MCUs 32, 34 and 36 are associated. In some embodiments, interlock signaling path 54 and address signaling path 66 are each single wire paths, and share a common ground 38 (which is also the ground for power supply 40). Using single wires and a common ground for each of paths 54 and 66 allows for reduced numbers of wires and connector pins in some embodiments, thus in turn providing improved reliability and reduced cost.

Figure 5:
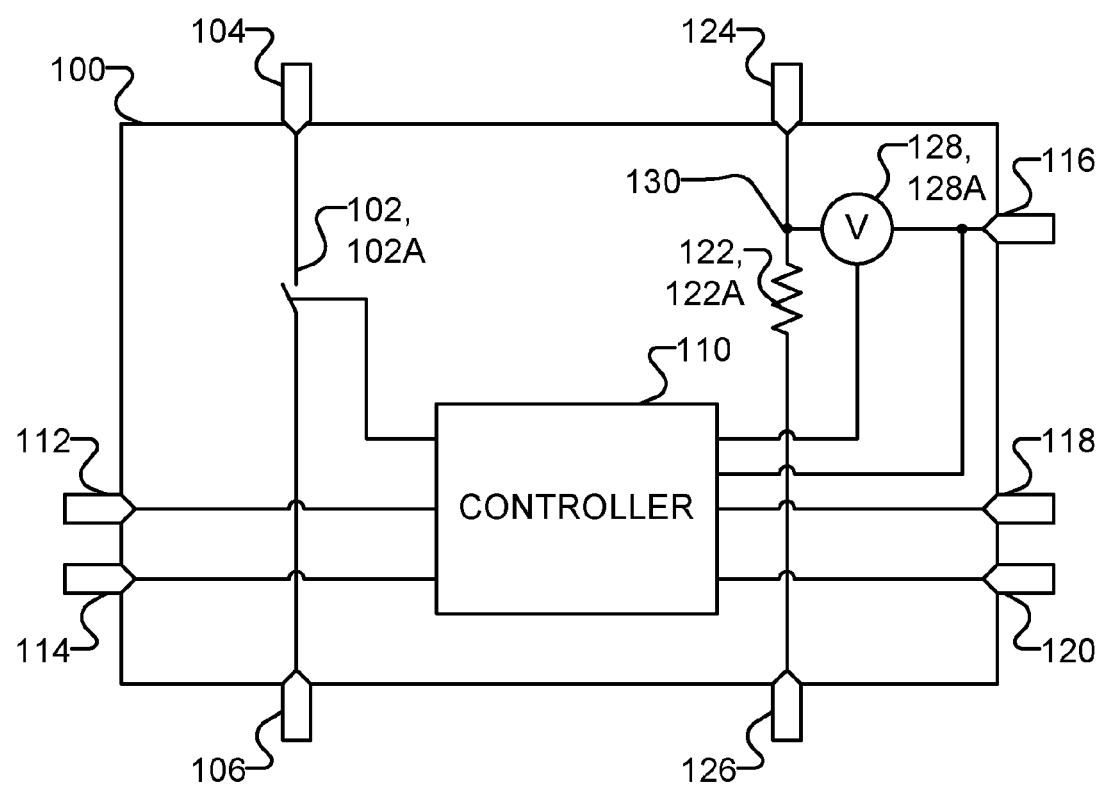
FIG. 5 is a schematic diagram of a battery module control unit according to an example embodiment.

FIG. 5 shows an MCU 100 according to an example embodiment. MCUs 32, 34 and 36 in the example discussed above may, for example, have the same or similar features as MCU 100. MCU 100 comprises an interlock signal coupler 102 connected between an interlock signal input 104 and an interlock signal output 106. In the illustrated embodiment, interlock signal coupler 102 of MCU 100 comprises an electrical switch 102A. In other embodiments, interlock signal coupler 102 may comprise a different electrical component, such as, for example, a fixed electrical resistance, a variable electrical resistance, a substantially resistance free electrical connector, or the like.

MCU 100 comprises a controller 110, which may comprise one or more central processing units (CPU), one or more microprocessors, one or more microcontrollers, one or more field-programmable gate arrays (FPGA), application-specific integrated circuits (ASIC), logic circuits, combinations thereof or any other suitable processing unit(s) comprising hardware and/or firmware and/or software capable of functioning as described herein. In some embodiments, controller 110 comprises a plurality of independent microprocessors, microcontrollers, field-programmable gate arrays (FPGA), application-specific integrated circuits (ASIC), logic circuits, combinations thereof and/or the like, each configured to perform a different aspect of the functionality of controller 110 described herein. Controller 110 is configured to communicate over a shared communication medium according to a communication protocol (e.g., a CAN bus). MCU 100 comprises connections 112, 114, and 116 by which controller 110 may be connected to a communications medium, a low voltage supply, an electrical ground, respectively.

MCU 100 comprises one or more inputs 118 connectable to stimulus sources, sensor apparatus and/or the like by which controller 110 may receive signals indicative of conditions at battery modules, battery cells, and/or related apparatus associated with MCU 100. Controller 110 may be configured to process such signals and/or communicate information derived from such signals over a communications medium to which MCU 100 is connected. MCU 100 comprises one or more outputs 120 connectable to battery modules, battery cells and/or related apparatus associated with MCU 100 by which controller 110 may send signals for controlling such battery modules, battery cells and/or related apparatus. Controller 110 may be configured to control such battery modules, battery cells and/or related apparatus based at least in part on information (e.g., instructions, operating modes, etc.) received over a communications medium to which MCU 100 is connected. Some inputs 118 and outputs 120 may be located on the same physical connection (e.g., a bi-directional connection).

In some embodiments, interlock signal coupler 102 is controllable and controller 110 is coupled to control interlock signal coupler 102. For example, controller 110 may be coupled to control the resistance of interlock signal coupler 102 to current between interlock signal input 104 and interlock signal output 106. Controller 110 may be configured to cause an interlock condition along an interlock signaling path to which MCU 100 belongs when it detects one or more predetermined conditions at a battery module, battery cell and/or related apparatus associated with MCU 100 (e.g., battery cell temperature outside operating range, battery cell voltage outside of operating range, etc.) by controlling interlock signal coupler 102 to present a first resistance to current between input 104 and output 106 when no such predetermined condition is detected, and to present a second resistance to current between input 104 and output 106, different from the first resistance, when at least one such predetermined condition is detected.

For example, controller 110 may be configured to cause interlock signal coupler 102 to present infinite resistant to current between interlock signal input 104 and interlock signal output 106 (e.g., an open circuit) when it detects a predetermined condition at an associated battery module, battery cell and/or related apparatus and to present substantially zero resistance to current between interlock signal input 104 and interlock signal output 106 otherwise.

In some embodiments, controller 110 is configured to detect one or more predetermined conditions at a battery module, battery cell and/or related apparatus associated with MCU 100 based on signals received via input(s) 118 from stimulus sources (e.g., voltage signals from battery modules and/or cells, etc.), sensor apparatus (e.g., signals from temperature sensors, signals from voltage detectors external to MCU 100, signals from current detectors external to MCU 100 etc.), or the like. For example, controller 110 may be configured to detect a temperature interlock condition when a temperature indicated by a signal received from a thermometers (e.g., a voltage signal produced by a thermocouple) is outside of a predetermined range. For another example, controller 110 may be configured to detect an over-voltage interlock condition when a voltage indicated by a signal received from a voltage detector is outside of a predetermined range.

MCU 100 comprises an address signal coupler 122 connected between an address signal input 124 and an address signal output 126. Address signal coupler 122 is configured to modify a signal between address signal input 124 and address signal output 126 in a predetermined manner. In the illustrated embodiment, address signal coupler 122 of MCU 100 comprises a resistor 122A. Resistor 122A has a predetermined electrical resistance. In some embodiments, resistor 122A has a resistance to electrical current in the range of 1 Ohm to 1 kOhm, depending on the address signal current supplied. In some embodiments, resistor 122A has a value of approximately 250 Ohms.

MCU 100 comprises an address signal detector 128 configured to generate a signal indicative of a signal detected at a point on address signaling path 66 between address signal input 124 and address signal output 126, and to communicate the generated signal to controller 110. Where MCU 100 is one of a plurality of similarly configured MCUs along an addressing signaling path, the signal detected by address signal detector 128 depends on the signal input to the address signaling path by an address signaling source, and, depending on the location of MCU 100 along that address signaling path, the effect that the address signal couplers of MCUs along the address signaling path have on signals on the address signaling path.

In the illustrated embodiment, address signal detector 128 comprises a voltage detector 128A, which is configured generate a signal indicative the voltage between a point 130 (located in the FIG. 5 embodiment between resistor 122A and address signal input 124) and a reference voltage (in the FIG. 5 embodiment, ground 116), and to communicate the generated signal to controller 110. Voltage detector 128A may comprise an analog to digital converter, or other suitable voltage detector, for example. It will be appreciated that when an MCU 100 according to the FIG. 5 embodiment is connected in the manner of MCU 32, 34 or 36, voltage detector 128A supplies controller 110 with a signal indicative of the voltage at the terminal of MCU 100 connected to the address signaling path nearest to the address signal source. In other embodiments, point 130 may instead be located on the other side of resistor 122A, and voltage detector 128A may supply controller 110 with a signal indicative of the voltage at the terminal of MCU 100 connected to the address signaling path farthest from the address signal source.

In some embodiments, controller 110 is configured to determine the position P of MCU 100 along an address signaling path to which it is connected relative to the end of that address signaling path based at least in part on signal detected at a point on address signaling path 66 between address signal input 124 and address signal output 126 (e.g., by way of a signal generated by address signal detector 128), a predetermined property of a reference address signal output onto the address signaling path and a predetermined effect of address signal coupler 122 on signals on the address signaling path. For example, controller 110 may be configured to determine the position P of MCU 100 along an address signaling path to which it is connected relative to the end of that address signaling path according to the formula $P=V/IR$, where V is the voltage detected by voltage detector 128A, I is a predetermined address current value and R is a predetermined resistance value. The predetermined address current value I may correspond to the address current of an electrical system in which MCU 100 is installed. The predetermined value for R may correspond to the resistance of resistor 122A.

Controller 110 may configured obtain a predetermined property of the signal output onto the address signaling path by an address signal source (e.g., predetermined address current value I) and an indication of the predetermined effect of MCUs of the address signaling path on signals on the address signaling path (e.g., a predetermined resistance value R) from any suitable source. For example, such values may be preprogrammed in a memory of controller 110, determined from hardware comprises in controller 110 (e.g., logic circuits, etc.) or MCU 100 (e.g., DIP switches, etc.), or the like. In some embodiments, the address signaling source comprises a constant current source and all MCUs are presented with the same series current along the address signaling path. Controller 110 may be configured to store a determined position P in a memory and/or to determine an address for use in communications with BCU 30 based on the determined position (e.g., using a lookup table, computable function, or the like) and store such address in a memory.

In some embodiments, MCU 100 may be configured to respond to another MCU being in interlock, for example by ceasing any control functions such as balancing. For example, MCU 100 may be configured to communicate with other MCUs through a local network (e.g. a CAN bus). In other, currently preferred, embodiments, any response by MCU 100 to interlock conditions at another MCU is controlled by the BCU, in order to create a coordinated response across the entire system.

MCU 100 may comprise connectors associated with interlock signal input 104, interlock signal output 106, address signal input 124 and/or address signal output 126 configured for connecting MCU 100 to one or more other MCUs 100 in daisy chain fashion, such as is shown in system 20 of FIG. 2. In some embodiments, MCU 100 may be selectively configurable as an "end MCU", for example by grounding the interlock and address paths internally. In some embodiments, connectors for coupling MCU 100 to another MCU may be configured to internally ground the interlock and address signaling paths by default unless another MCU is coupled thereto.

Figure 6:
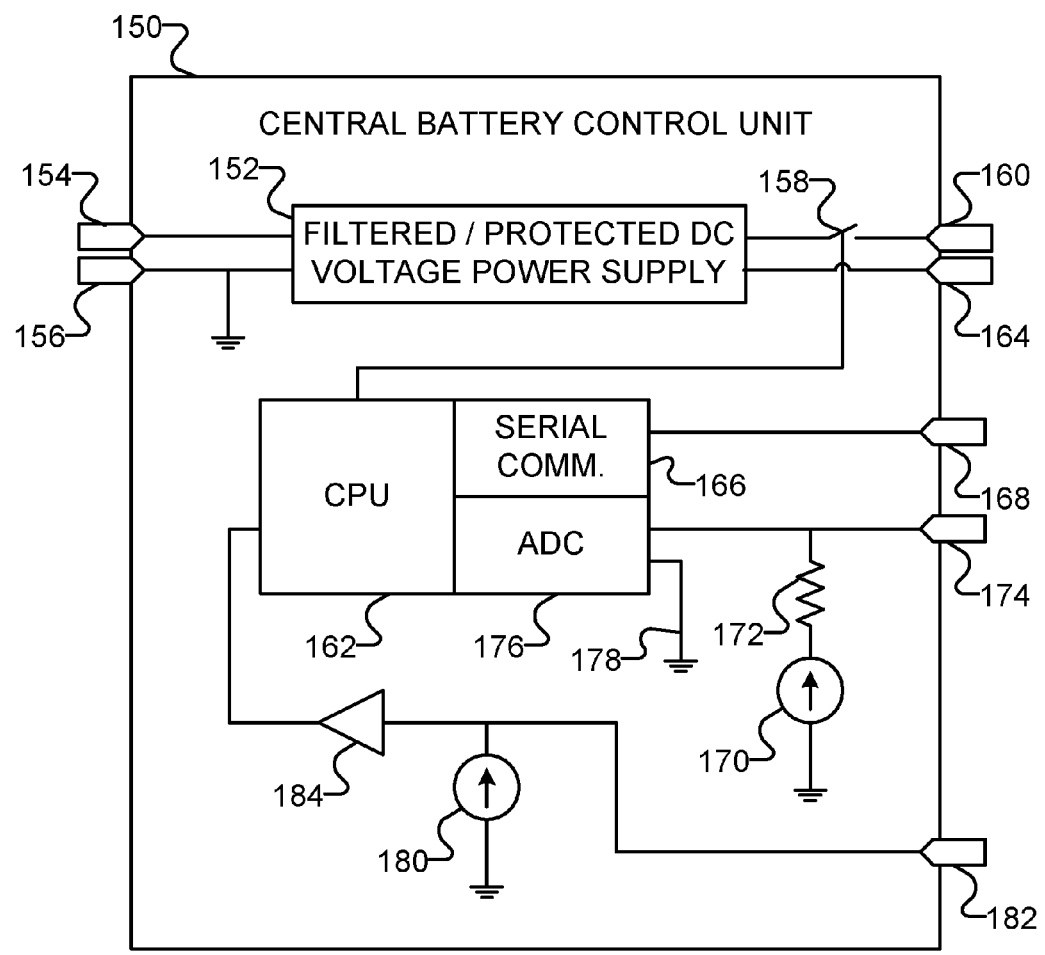
FIG. 6 is a schematic diagram of a central battery control unit according to an example embodiment.

FIG. 6 is a schematic diagram of a central battery control unit (BCU) 150 according to an example embodiment. BCU 150 comprises a DC voltage power supply 152. DC voltage power supply 152 is connected to receive an input DC voltage across source voltage input 154 and source ground input 156. DC voltage power supply 152 is connected by switch 158 to DC supply voltage output 160. Switch 158 is controlled by a CPU 162.

When switch 158 is closed, DC voltage power supply 152 outputs a regulated DC voltage across supply voltage output 160 and supply ground output 164. DC voltage power supply 152 supplies power to other components of BCU 150 (connections not shown in FIG. 6). DC voltage power supply 152 filters source DC voltage received across inputs 154 and 156, and protects the voltage output at outputs 160 and 164 from surges and the like, which may occur in the source DC voltage received across inputs 154 and 156.

BCU 150 comprises a serial communications interface 166, which is connected to a communications bus (e.g., a CAN bus) at bus connection 168. Serial communications interface 166 is configured to communicate messages between CPU 162 and other devices on the connected bus (e.g., MCUs, other devices, etc.).

BCU 150 comprises a constant DC current source 170 connected to supply a constant DC electric current having a predetermined magnitude to a connected address signaling path through a resistor 172. Resistor 172 has a predetermined resistance. BCU 150 may be connected to an address signaling path at address signal output 174. BCU 150 comprises an analog to digital converter 176 connected to address signal output 174. Converter 176 is configured to convert an analog voltage at address signal output 174 to a digital value, using an internal ground 178 as a reference. Converter 176 is configured to communicate this value to CPU 162.

CPU 162 is configured to determine the number of MCUs in an address signaling path to which BCU 150 is connected based at least in part on the digital value provided by converter 176, a value indicative of the predetermined magnitude of the constant DC electric current supplied by constant DC current source 170, and the predetermined resistance of resistor 172. CPU 162 may be configured to execute all or part of method 90.

BCU 150 comprises a constant DC current source 180 connected to supply a constant DC electric current having a predetermined magnitude to an interlock signaling path. BCU 150 may be connected to an interlock signaling path at interlock signaling path output 182. A buffering amplifier 184 supplies an analog voltage indicative of the voltage at the output of current source 180 to CPU 162. CPU 162 is configured to determine whether an interlock condition exists along the connected interlock signaling path based on the analog voltage output by buffering amplifier 184. For example, CPU 162 may comprise an analog to digital converter that converts the analog voltage output by buffering amplifier 184 to a digital value, and may be configured to compare this value to a threshold. CPU 162 may be configured to execute all or part of method 80.

Figure 7:
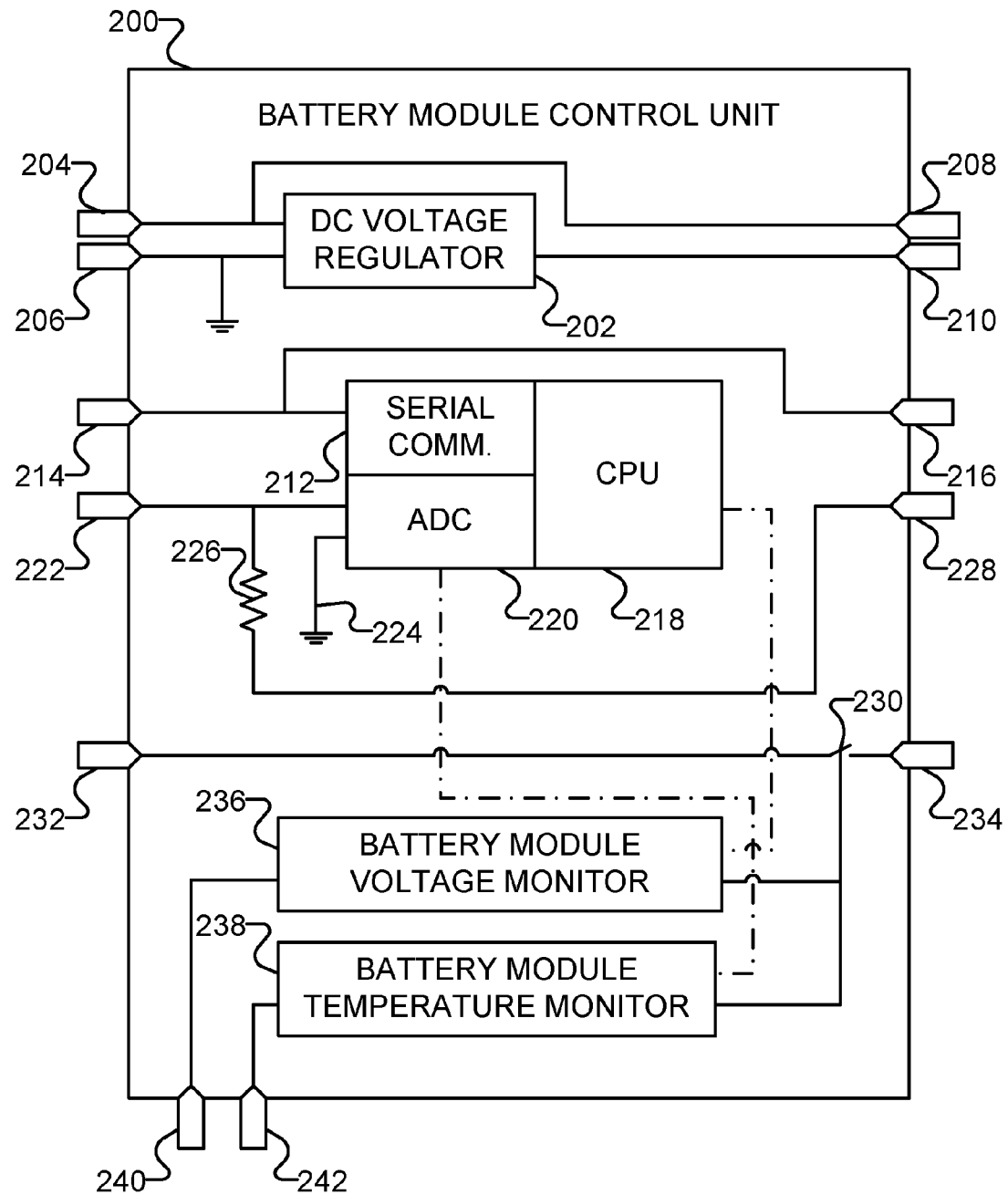
FIG. 7 is a schematic diagram of a battery module control unit according to an example embodiment.

FIG. 7 is a schematic diagram of a battery module control unit (MCU) 200 according to an example embodiment. MCU 200 comprises a DC voltage regulator 202 connected to regulate a DC supply voltage received across supply voltage input 204 and supply ground input 206. DC voltage regulator 202 is connected to supply power to other components of MCU 200 (connections not shown in FIG. 7). DC voltage regulator 202 is a step-down regulator, which converts the system DC supply voltage (e.g. 24V) to a lower electronics voltage (e.g. 5V). In the illustrated embodiment, the power at supply voltage input 204 is fed straight through to supply voltage output 208, and DC voltage regulator 202 pulls power therefrom to provide regulated power to components of MCU 200. In other embodiments, a single DC Voltage regulator may instead be provided on the BCU, providing regulated 5V power at outputs 160 and 164 (see FIG. 6). This arrangement would eliminate the need for on-board voltage regulators on each of the MCUs. However, providing voltage regulation on each MCU may improve the performance and quality of the power regulation and noise susceptibility within the entire system where a variable number of MCUs can be connected through wire harnesses.

MCU 200 comprises a serial communications interface 212. Serial communications interface is connected along a communications bus passing through MCU 200 between bus input 214 and bus output 216. Serial communications interface 212 is configured to communicate messages between CPU 218 and other devices on the communications bus (e.g., a BCU, other MCUs, etc.).

MCU 200 comprises an analog to digital converter 220 connected to address signal input 222. Converter 220 is configured to convert an analog voltage at address signal input 222 to a digital value, using an internal ground 224 as a reference. Converter 220 is configured to communicate this value to CPU 218. A resistor 226 having a predetermined resistance connects address signal input 222 to address signal output 228.

MCU 200 may be connected along an address signaling path at address signal input 222 and address signal output 228. CPU 218 is configured to determine the a position of MCU 200 along an address signaling to which it is connected based at least in part on the digital value provided by converter 220, a predetermined value indicative of the electrical current on the connected address signaling, and the predetermined resistance of resistor 226. CPU 218 may be configured to execute all or part of method 90.

MCU 200 comprises an interlock switch 230 connected between interlock signal input 232 and interlock signal output 234. MCU 200 may be connected along an interlock signaling path at interlock signal input 232 and interlock signal output 234. Interlock switch 230 is controlled by battery module voltage monitor 236 and battery module temperature monitor 238.

Battery module voltage monitor 236 is connected to receive from battery module voltage input 240 a signal indicative of one or more voltages at an associated battery module. Battery module voltage input 240 may be directly connected to a terminal of an associated battery module, for example (i.e., battery module voltage monitor 236 may monitor voltages at a connected battery module directly). Battery module voltage monitor 236 is configured to open interlock switch 230 if a monitored voltage of a connected battery module exceeds a first predetermined threshold or is under a second predetermined threshold. The first and second predetermined thresholds may be set based on physical characteristics of the associated battery module to avoid potentially dangerous over voltage or under voltage conditions. In some embodiments, battery module voltage monitor 236 also provides voltage signals to CPU 218, and CPU 218 may be programmed with software configured to determine dynamic and/or conditional thresholds based on the voltage signals and generate warnings and/or alarms based on the determined thresholds. CPU 218 may also communicate with the BCU to provide the voltage signals to the BCU, and/or provide or receive determined thresholds.

Battery module temperature monitor 238 is connected to receive from battery module temperature input 242 a signal indicative of one or more temperatures at an associated battery module. Battery module temperature input 242 may be connected to a thermocouple coupled to an associated battery module, for example. Battery module temperature monitor 238 is configured to open interlock switch 230 if a monitored temperature of a connected battery module exceeds a first predetermined threshold or is under a second predetermined threshold. The first and second predetermined thresholds may be set based on physical characteristics of the associated battery module to avoid potentially dangerous temperature conditions. In some embodiments, battery module temperature monitor 238 also provides temperature signals to CPU 218, and CPU 218 may be programmed with software configured to determine dynamic and/or conditional thresholds based on the temperature signals and generate warnings and/or alarms based on the determined thresholds. CPU 218 may also communicate with the BCU to provide the temperature signals to the BCU, and/or provide or receive determined thresholds.

In some embodiments, CPU 218 receives voltage signals from battery module voltage monitor 236 and, respectively, by means of a digital communications bus between CPU 218 and monitor 236 such as, for example, an Inter IC (I2C), a Serial Peripheral Interface (SPI) or a CAN bus. In some embodiments, CPU 218 receives temperature signals from battery module temperature monitor 238 through analog to digital converter 220. In some embodiments, CPU 218 also receives signals from other sources, such as, for example redundant temperature and/or voltage signals from analog sensors, signals indicating the status of switch 230, signals indicating a ground fault in the electrical system powered by the monitored battery cells, and the like.

Battery monitoring systems which comprise BCUs and MCUs such as those described above may also include additional components for providing signals to controllers, CPUs or other processing elements of the BCUs and MCUs indicative of additional characteristics and/or potential problems in the overall electrical system for which the monitored battery cells provide power. In some embodiments, a ground fault detection unit (GFDU) may be integrated into a battery monitoring system. Providing a battery monitoring system with an integrated GFDU may provide increased safety and reliability and decreased cost in some embodiments. An example GFDU is discussed below with reference to FIG. 8. In some embodiments, a GFDU may be located in the BCU of the battery monitoring system. In other embodiments a GFDU may be directly or indirectly coupled to the DC voltage supply provided by the monitored battery stack.

Figure 8:
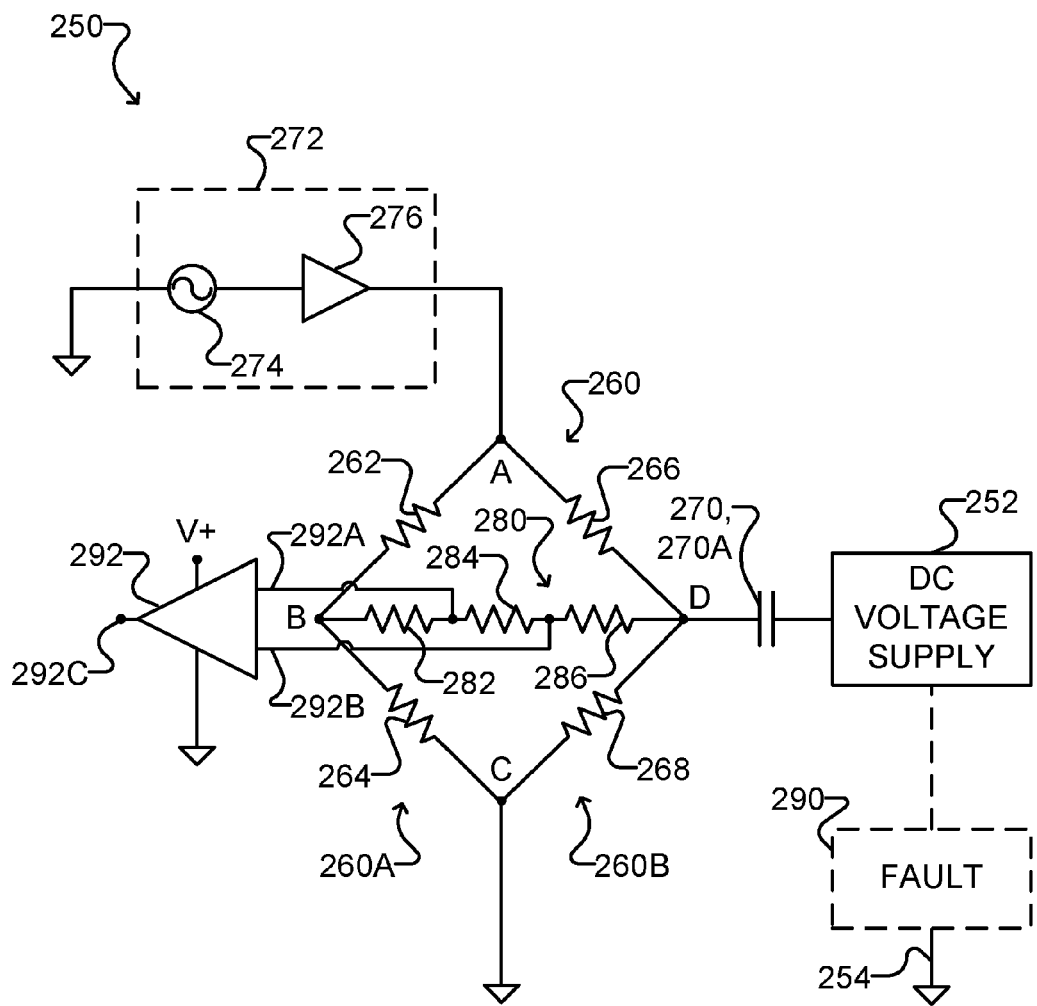
FIG. 8 is a schematic diagram of a ground fault detection unit for use in automotive battery power systems according to an example embodiment.

FIG. 8 is a schematic diagram of a circuit 250 for detecting and determining the impedance of a ground fault between a DC voltage supply rail 252 and a ground 254. Circuit 250 may be applied to automotive electrical systems (e.g., DC voltage supply rail 252 may comprise the high voltage DC supply rail of an electric-powered automotive vehicle).

Circuit 250 comprises a Wheatstone bridge 260. Wheatstone bridge 260 comprises a first leg 260A extending between nodes A and C having resistors 262 and 264 joined at node B. Wheatstone bridge 260 comprises a second leg 260B extending between nodes A and C having resistors 266 and 268 joined at node D. Wheatstone bridge 260 is balanced because the ratio of the resistances of resistors 262 and 264 in first leg 260A is substantially equal to the ratio of the resistance of resistors 266 and 268 in second leg 260B (i.e., $R_{262}/R_{264} = R_{266}/R_{268}$).

In circuit 250, node C is connected to ground 254 and a DC voltage isolator 270, namely capacitor 270A, couples DC voltage supply rail 252 to node D. Since capacitor 270A presents a large impedance to DC current, current from DC voltage supply rail 252 is prevented from flowing to ground 254 through Wheatstone bridge 260. In other embodiments, other components may be used in addition to or substitution for capacitor 270A to prevent current from DC voltage supply rail 252 flowing into Wheatstone bridge 260. For instance, components (e.g., filters) may be provided between node D of Wheatstone bridge 260 and DC voltage supply rail 252 to protect Wheatstone bridge 260 from electrical noise on DC voltage supply rail 252 (e.g., to prevent DC voltage from flowing to ground through bridge 260), while allowing AC currents to be passed through to bridge 260 in order to detect a potential fault path from the DC source to ground.

Circuit 250 comprises a stimulus source 272 connected to provide transient electrical stimulus to node A. Stimulus source 272 includes an alternating current (AC) voltage source 272 is driven by a buffering amplifier 274 connected to node A. AC voltage source 272 may be configured to produce one or more time varying AC voltage waveforms, such as sinusoidal, square wave, pulse train, sawtooth and like wave forms. AC voltage waveforms produced by AC voltage source 272 may be periodic or transient. In some embodiments, AC voltage source 272 is configured to provide period AC voltage waveforms at a plurality of different frequencies.

When Wheatstone bridge 260 is balanced, current entering Wheatstone bridge 260 at node 260 (e.g., as a result of the stimulus voltage provided by buffering amplifier 274 at node A) causes substantially equal voltages to appear at nodes B and D. As a result, there is substantially no current through a bridge 280 between nodes B and D, which comprises a series connection of resistors 282, 284 and 286.

Since the impedance of capacitor 270 to AC voltage is low, AC current entering Wheatstone bridge 260 at node A may flow from second leg 260B of Wheatstone bridge 260 through node D to DC voltage supply rail 252. When a fault 290 is present between DC voltage supply rail 252 and ground 254, the fault provides a ground path from node D in parallel with resistor 268. As a result, the impedance between node D and C will differ from the impedance between nodes B and D, and current entering Wheatstone bridge 260 at node A will cause different voltages to appear at nodes B and D.

The additional ground path of fault 290 will be reflected in a current between nodes B and D, which creates a voltage across resistor 284. Circuit 250 comprises a differential amplifier whose inputs 292A and 292B are connected across resistor 284 of bridge 280. The signal generated by differential amplifier 292 at its output 292C depends on voltage across resistor 284 and is indicative of the impedance of fault 290.

In some embodiments, the reactance and resistance components of the impedance of fault 290 are determined based on the phase relationship between of the voltage at output 292C of differential amplifier 292 and the stimulus voltage of buffering amplifier 274. In some embodiments, the output 292C of differential amplifier 292 is provided to processing elements at the BCU. Because the stimulus signal provided by stimulus source 272 is generated and known, and the configuration of circuit 250 is known, a transfer function can be defined and evaluated by the BCU's processing elements to determine an unknown fault resistance (e.g. a resistance in parallel to resistor 268). The transfer function may be solved for impedance from which the real component of 'resistance' may be extracted.

In some embodiments, resistances for resistors 262, 264, 266 and 268 may be on the order of 1 MOhm. In some embodiments resistors 282 and 286 each have resistances of approximately 500 kOhm, and resistor 284 may have a resistance of approximately 100 kOhm. In some embodiments, capacitor 270A may have a capacitance of about 1 µF or more.

Certain implementations of the invention comprise computer processors which execute software instructions which cause the processors to perform a method of the invention. For example, one or more processors in a controller may implement the methods described herein by executing software instructions in a program memory accessible to the processors.

Where a component (e.g. a controller, circuit, resistor, capacitor, voltage detector, current detector, signal source, current source, voltage source, coupler, switch, buffering amplifier, differential amplifier, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. For example:

MCUs may powered by means other than a low voltage supply generated by a BCU (e.g, by the battery modules and/or battery cells with which the MCUs are respectively associated).

Components of described embodiments may be combined. For example, controllers described herein may comprise voltage detectors (such as analog to digital converters, for example), current sources (such as constant DC current sources), communications interfaces (such as serial communications interfaces), or the like.

Shared medium communications between and/or among a BCU and MCU(s) may be performed in the optical domain.

Interlock signaling may be performed in the optical domain. For example, an interlock signaling path may comprise an optical path (e.g., comprising multimode optical fiber and/or single mode optical fiber) terminated by a reflective end, an interlock signal source may comprise a light source, an interlock signal coupler of an MCU may comprise an optical switch, and an interlock signal detector may comprise a photodetector configured to detect light returned from the interlock signaling path. In some embodiments, an optical interlock signaling path may terminate at a reflector and the light source, photodetector and optical interlock signaling path may be connected to ports of an optical circulator located between the light source and the MCU on the interlock signaling path nearest the light source. In some embodiments, the light source may be configured to adjust the optical power of the light it emits into the interlock signaling path based on the optical power of light returned from the interlock signaling path (e.g., to achieve a predetermined returned optical power).

Address signaling may be performed in the optical domain. For example, an address signaling path may comprise an optical path (e.g., comprising multimode optical fiber and/or single mode optical fiber) terminated by a reflective end, an address signal source may comprise a light source, an address signal coupler may comprise an optical attenuator configured to attenuate an optical signal on the address signaling path by a predetermined amount, and an address signal detector may comprise a photodetector configured to detect light returned from the address signaling path (e.g., address signaling path may terminate at a reflector and the light source, photodetector and optical address signaling path may be connected to ports of an optical circulator). In some embodiments, an optical address signaling path may terminate at a reflector and the light source, photodetector and optical address signaling path may be connected to ports of an optical circulator located between the light source and the MCU on the address signaling path nearest the light source. In some embodiments, the light source may be configured to adjust the optical power of the light it emits into the address signaling path based on the optical power of light returned from the address signaling path (e.g., to achieve a predetermined returned optical power).

Embodiments of the invention may be implemented using a variety of processing elements, including without limitation specifically designed hardware, configurable hardware, programmable data processors configured by the provision of software (which may optionally comprise 'firmware') capable of executing on the data processors, special purpose computers or data processors that are specifically programmed, configured, or constructed to perform one or more steps in a method as explained in detail herein and/or combinations of two or more of these. Examples of specifically designed hardware include: logic circuits, application-specific integrated circuits ("ASICs"), large scale integrated circuits ("LSIs"), very large scale integrated circuits ("VLSIs") and the like. Examples of configurable hardware include: one or more programmable logic devices such as programmable array logic ("PALs"), programmable logic arrays ("PLAs") and field programmable gate arrays ("FPGAs")). Examples of programmable data processors include: microprocessors, digital signal processors ("DSPs"), embedded processors, graphics processors, math co-processors, general purpose computers, on-board automotive computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), Controller Area Network (CAN), or the Internet, wired or wireless data links, electromagnetic signals, or other data communication channels.

For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. In addition, while elements are at times shown as being performed sequentially, they may instead be performed simultaneously or in different sequences. It is therefore intended that the following claims are interpreted to include all such variations as are within their intended scope.

Certain aspects of the invention may also be provided in the form of a program product. The program product may comprise any non-transitory medium which carries a set of computer-readable instructions which, when executed by a data processor or other processing elements, cause the data processor to execute a method of the invention. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, aspects of the invention may be implemented in software. For greater clarity, "software" includes any instructions executed on a processor, and may include (but is not limited to) firmware, resident software, microcode, and the like. Both processing hardware and software may be centralized or distributed (or a combination thereof), in whole or in part, as known to those skilled in the art. For example, software and other modules may be accessible to processing elements via local memory, via a network, via a browser or other application in a distributed computing context, or via other means suitable for the purposes described above.

Specific examples of systems, methods and apparatus have been described herein for purposes of illustration. These are only examples. The technology provided herein can be applied to systems other than the example systems described above. Many alterations, modifications, additions, omissions and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

While a number of exemplary aspects and embodiments have been discussed above, those of skill in the art will recognize certain modifications, permutations, additions and sub-combinations thereof. For example, aspects of the invention include, without limitation:

1. A module control unit connectable to monitor a battery module of a battery stack comprising a plurality of modules, the module control unit comprising:
   i. an address signal input and an address signal output for connecting the module control unit along an address signaling path;
   ii. an address signal coupler connected between the address signal input and the address signal output;
   iii. a controller configured determine a position of the module control unit along the address signaling path based at least in part on:
      1. a signal detected on the address signaling path,
      2. a predetermined property of a reference address signal, and
      3. a predetermined property of the address signal coupler.

2. A module control unit according to aspect 1 wherein the address signaling path comprises an electrically conductive path.
3. A module control unit according to aspect 2 wherein the address signal coupler comprises a resistor and the predetermined property of the address signal coupler comprises a resistance of the resistor.
4. A module control unit according to aspect 2 wherein the signal detected on the address signaling path comprises a voltage signal.
5. A module control unit according to aspect 4 wherein the voltage signal comprises a voltage signal on the address signaling path between the address signal input and the address signal input.
6. A module control unit according to aspect 5 wherein the voltage signal comprises a voltage signal on the address signaling path between the address signal input and the address signal coupler.
7. A module control unit according to aspect 5 wherein the voltage signal comprises a voltage signal on the address signaling path between the address signal coupler and the address signal output.
8. A module control unit according to any of aspects 5 to 7 comprising a voltage detector configured to generate a signal indicative of the voltage signal, and wherein the controller is configured to receive the generated signal.
9. A module control unit according to any of aspects 2 to 8 wherein the reference address signal comprises a substantially constant magnitude electric current and the predetermined property of the reference address signal comprises the magnitude of the current.
10. A module control unit according to any of aspects 1 to 9 wherein the controller is configured to determine a position of the battery module control unit along the address signaling path based at least in part on the expression V/IR, where V is a value indicative of a voltage signal detected on the address signaling path, I is a value indicative of a magnitude of a reference address current and R is a value indicative of a resistance of the address signal coupler.
11. A module control unit according to any of aspects 1 to 10 wherein each MCU comprises an interlock signal input and an interlock signal output for connecting the MCU along the interlock signaling path, and an interlock signal coupler connected between the interlock signal input and the interlock signal output.
12. A module control unit according to aspect 11 wherein each MCU comprises one or more battery inputs for receiving battery parameter signals indicating one or more parameters of the associated battery module, and wherein each MCU controller is configured to adjust a property of the interlock signal coupler based on the battery parameter signals.
13. A module control unit according to aspect 12 wherein the interlock signal coupler comprises a switch and wherein the MCU controller is configured to open the switch when the battery parameter signals indicate an interlock condition.
14. A module control unit according to any of aspects 11 to 13 wherein the address signaling path and the interlock signaling path share a common ground with a low voltage power supply provided by a battery control unit (BCU).
15. A module control unit according to aspect 14 wherein the MCUs are series connected in daisy-chain fashion to the BCU.

16. A module control unit according to aspect 15 wherein a single daisy-chain harness is used to connect between each pair of series connected MCUs and between the BCU and a closest MCU, the daisy-chain harness comprising a plurality of connectors.
17. A central battery control unit connectable to an address signaling path comprising a plurality of serially-connected battery module control units, each of the plurality of battery module control units comprising an address signal coupler, the central battery control unit comprising:
   i. an address signal source configured to output a reference address signal on a connected address signaling path; and
   ii. a controller configured determine a number of the plurality of module control units on the connected address signaling path based at least in part on:
      1. a signal detected on the address signaling path,
      2. a predetermined property of the reference address signal, and
      3. a predetermined property of the address signal coupler.
18. A central battery control unit according to aspect 17 wherein the address signaling path comprises an electrically conductive path.
19. A central battery control unit according to aspect 18 wherein the predetermined property of the address signal coupler comprises a resistance.
20. A central battery control unit according to aspect 18 wherein the signal detected on the address signaling path comprises a voltage signal.
21. A central battery control unit according to aspect 20 wherein the voltage signal comprises a voltage signal on the address signaling path between the address signal source and a one of the plurality of MCUs nearest along the address signaling path to the address signal source.
22. A central battery control unit according to aspect 21 comprising a voltage detector configured to generate a signal indicative of the voltage signal, and wherein the controller is configured to receive the generated signal.
23. A central battery control unit according to any of aspects 18 to 22 wherein the address signal source comprises a constant current source and the predetermined property of the reference address signal comprises the magnitude of the electric current output by the constant current source.
24. A central battery control unit according to any of aspects 17 to 23 wherein the controller is configured to determine a number of the plurality of module control units on address signaling path based at least in part on the expression V/IR, where V is a value indicative of a voltage signal detected on the address signaling path, I is a value indicative of a magnitude of a reference address current and R is a value indicative of the resistance of the address signal coupler.
25. A central battery control unit according to any of aspects 17 to 24 wherein the BCU comprises an interlock signal source configured to output an interlock signal on an interlock signaling path.
26. A ground fault detection unit comprising:
   i. a Wheatstone bridge having:
      1. first and second legs connected at their respective first ends to a first node and connected at their respective second ends to a second node, each leg comprising two series connected resistors, and
      2. a bridge connected at a first end to a junction between the two series connected resistors of the first leg and at a second end to a junction between the two series connected resistors of the second leg, the bridge comprising a resistor;
   ii. a DC current isolator connected at a first end to the junction between the two series connected resistors of the first leg;
   iii. a stimulus source connected to provide transient electrical stimulus to the first node.
27. A ground fault detection unit according to aspect 26 comprising a differential amplifier having inputs connected across the resistor of the bridge.
28. A battery monitoring system comprising a plurality of module control units according to any of aspects 1 to 16 and a central battery control unit according to any of aspects 17 to 25.
29. A battery monitoring system according to aspect 28 comprising a ground fault detection unit according to any of aspects 26 to 27.
30. A battery monitoring systems according to any of aspects 28 to 29 wherein the battery stack comprises an automotive battery stack configured to provide a high voltage DC output, and wherein the central battery control uni comprises a power supply connectable to the high voltage DC output and configured to provide a low voltage DC supply for the module control units.
31. A method for monitoring a battery stack comprising a plurality of battery cells. The method comprises connecting each of a plurality of module control units (MCUs) to an associated battery module comprising one or more of the plurality of battery cells, connecting the MCUs together in series along a supply rail, a common ground, and an address signaling path wherein each MCU comprises an address signal coupler forming part of the address signaling path, providing a low voltage electrical supply across the supply rail and common ground, providing an address signal on the address signaling path, detecting a source signal on the address signaling path between the source of the address signal and a closest MCU, detecting a local signal on the address signaling path at each of the MCUs, determining a number of the plurality of MCUs on the connected address signaling path based at least in part on the source signal, a predetermined property of the reference address signal, and a predetermined property of the address signal couplers, and determining a position of each MCU along the address signaling path based at least in part on the local signal on the address signaling path, a predetermined property of the reference address signal, and a predetermined property of the address signal coupler.

It is therefore intended that the following appended claims and claims hereafter introduced are interpreted to include all such modifications, permutations, additions, omissions and sub-combinations as may reasonably be inferred. The scope of the claims should not be limited by the preferred embodiments set forth in the examples, but should be given the broadest interpretation consistent with the description as a whole.

What is claimed is:

1. A battery monitoring system connectable to monitor and control a battery stack comprising a plurality of battery cells, the system comprising:
   a central battery control unit (BCU) comprising a power supply configured to provide a low voltage electrical supply, a BCU controller, and an address signal source configured to output a reference address signal on an address signaling path; and a plurality of module control units (MCUs) connectable to receive the low voltage electrical supply from the BCU, each MCU connectable to a battery module comprising one or more of the plurality of battery cells, each MCU comprising an address signal input and an address signal output for connecting the module control unit along the address signaling path, an address signal coupler connected between the address signal input and the address signal output, and an MCU controller, wherein the BCU controller is configured to determine a number of the plurality of module control units connected on the address signaling path based at least in part on:
- a signal detected by the BCU on the address signaling path,
- a predetermined property of the reference address signal, and
- a predetermined property of the address signal coupler, and wherein each MCU controller is configured determine a position of an associated MCU along the address signaling path based at least in part on:
- a signal detected by the associated MCU on the address signaling path,
- a predetermined property of the reference address signal, and
- a predetermined property of the address signal coupler.

2. The system of claim 1 wherein the address signaling path comprises an electrically conductive path.

3. The system of claim 2 wherein the address signal coupler comprises a resistor and the predetermined property of the address signal coupler comprises a resistance of the resistor.

4. The system of claim 2 wherein the signal detected by the associated MCU on the address signaling path comprises a voltage signal on the address signaling path between the address signal input and the address signal input.

5. The system of claim 4 wherein the voltage signal comprises a voltage signal on the address signaling path between the address signal input and the address signal coupler.

6. The system of claim 4 wherein the voltage signal comprises a voltage signal on the address signaling path between the address signal coupler and the address signal output.

7. The system of claim 4 comprising a voltage detector configured to generate a signal indicative of the voltage signal, and wherein the MCU controller is configured to receive the generated signal.

8. The system of claim 2 wherein the reference address signal comprises a constant magnitude electric current and the predetermined property of the reference address signal comprises a magnitude of the current.

9. The system of claim 3 wherein the address signal couplers of all of the MCU have the same resistance.

10. The system of claim 9 wherein the MCU controller is configured to determine a position P of the associated MCU along the address signaling path according to the formula P=V/IR, where V is a value indicative of a voltage signal detected on the address signaling path, I is a value indicative of a magnitude of a reference address current and R is a value indicative of the resistance of the address signal coupler.

11. The system of claim 2 wherein the signal detected by the BCU on the address signaling path comprises a voltage signal on the address signaling path between the address signal source and a closest MCU of the plurality of MCUs nearest along the address signaling path to the address signal source.

12. The system of claim 11 comprising a voltage detector configured to generate a signal indicative of the voltage signal, and wherein the BCU controller is configured to receive the generated signal.

13. The system of claim 11 wherein the address signal couplers of all of the MCU have the same resistance, and wherein the BCU controller is configured to determine a number N of the plurality of module control units on address signaling path according to the formula N=V/IR, where V is a value indicative of a voltage signal detected on the address signaling path, I is a value indicative of a magnitude of a reference address current and R is a value indicative of the resistance of one of the address signal couplers.

14. The system of claim 1 wherein the BCU comprises an interlock signal source configured to output an interlock signal on an interlock signaling path and wherein each MCU comprises an interlock signal input and an interlock signal output for connecting the MCU along the interlock signaling path, and an interlock signal coupler connected between the interlock signal input and the interlock signal output.

15. The system of claim 14 wherein each MCU comprises one or more battery inputs for receiving battery parameter signals indicating one or more parameters of an associated battery module, and wherein each MCU controller is configured to adjust a property of the interlock signal coupler based on the battery parameter signals.

16. The system of claim 15 wherein the interlock signal coupler comprises a switch and wherein the MCU controller is configured to open the switch when the battery parameter signals indicate an interlock condition.

17. The system of claim 16 wherein the address signaling path and the interlock signaling path share a common ground with the low voltage electrical supply.

18. The system of claim 17 wherein the MCUs are series connected in daisy-chain fashion to the BCU.

19. The system of claim 18 wherein a single daisy-chain harness is used to connect between each pair of series connected MCUs and between the BCU and a closest MCU, the daisy-chain harness comprising a plurality of connectors.

20. A system according to claim 1 comprising a ground fault detection unit comprising:
a Wheatstone bridge having:
first and second legs connected at their respective first ends to a first node and connected at their respective second ends to a second node, each leg comprising two series connected resistors, and
a bridge connected at a first end to a junction between the two series connected resistors of the first leg and at a second end to a junction between the two series connected resistors of the second leg, the bridge comprising a resistor;
a DC current isolator connected at a first end to the junction between the two series connected resistors of the first leg and at a second end to a high voltage supply provided from the battery stack;
a stimulus source connected to provide transient electrical stimulus to the first node; and
a differential amplifier having inputs connected across the resistor of the bridge, and an output connected to provide a ground fault signal to the BCU controller.

* * * * *